United States Patent
Quinones et al.

(10) Patent No.: US 9,583,454 B2
(45) Date of Patent: *Feb. 28, 2017

(54) SEMICONDUCTOR DIE PACKAGE INCLUDING LOW STRESS CONFIGURATION

(75) Inventors: Maria Clemens Y. Quinones, Cebu (PH); Maria Cristina B. Estacio, Lapu-Lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 715 days.

This patent is subject to a terminal disclaimer.

(21) Appl. No.: 13/324,078

(22) Filed: Dec. 13, 2011

(65) Prior Publication Data

US 2012/0083071 A1  Apr. 5, 2012

Related U.S. Application Data

(60) Division of application No. 12/334,127, filed on Dec. 12, 2008, now Pat. No. 8,106,501, and a
(Continued)

(51) Int. Cl.
*H01L 21/60* (2006.01)
*H01L 23/00* (2006.01)
(Continued)

(52) U.S. Cl.
CPC .......... *H01L 24/40* (2013.01); *H01L 23/3107* (2013.01); *H01L 23/4334* (2013.01);
(Continued)

(58) Field of Classification Search
CPC ................................................ H01L 23/49575
(Continued)

(56) References Cited

U.S. PATENT DOCUMENTS 4,731,701 A  3/1988  Kuo et al.
4,751,199 A  6/1988  Phy
(Continued)

FOREIGN PATENT DOCUMENTS

JP  2005-328086 A  11/2005
JP  2005-354105 A  12/2005
(Continued)

OTHER PUBLICATIONS

Notice on Reason for Refusal mailed Nov. 17, 2015, issued in KR Application No. 2011-7015542, filed Dec. 9, 2009, 19 pages.

*Primary Examiner* — Dale E Page
*Assistant Examiner* — John Bodnar
(74) *Attorney, Agent, or Firm* — Brake Hughes Bellermann LLP

(57) ABSTRACT

A semiconductor die package. The semiconductor die package comprises a semiconductor die and a molded clip structure comprising a clip structure and a first molding material covering at least a portion of the clip structure. The first molding material exposes an outer surface of the clip structure. The clip structure is electrically coupled to the semiconductor die. The semiconductor die package further comprises a leadframe structure comprising a die attach pad and a plurality of leads extending from the die attach pad. The semiconductor die is on the die attach pad of the leadframe structure. A second molding material covers at least a portion of the semiconductor die and the leadframe structure. The semiconductor die package also includes a heat slug and a thermally conductive material coupling the heat slug to the exposed surface of the clip structure.

20 Claims, 18 Drawing Sheets

Related U.S. Application Data continuation-in-part of application No. 11/626,503, filed on Jan. 24, 2007, now Pat. No. 7,768,105.

(51) Int. Cl.
  *H01L 23/31*     (2006.01)
  *H01L 23/433*    (2006.01)
  *H01L 23/495*    (2006.01)

(52) U.S. Cl.
  CPC .. *H01L 23/49524* (2013.01); *H01L 23/49562* (2013.01); *H01L 24/31* (2013.01); *H01L 2224/2929* (2013.01); *H01L 2224/29111* (2013.01); *H01L 2224/29293* (2013.01); *H01L 2224/32245* (2013.01); *H01L 2224/40247* (2013.01); *H01L 2224/73263* (2013.01); *H01L 2224/83101* (2013.01); *H01L 2224/83191* (2013.01); *H01L 2924/00013* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01027* (2013.01); *H01L 2924/01029* (2013.01); *H01L 2924/0132* (2013.01); *H01L 2924/01033* (2013.01); *H01L 2924/01047* (2013.01); *H01L 2924/01078* (2013.01); *H01L 2924/01082* (2013.01); *H01L 2924/0781* (2013.01); *H01L 2924/10253* (2013.01); *H01L 2924/1305* (2013.01); *H01L 2924/1306* (2013.01); *H01L 2924/13091* (2013.01); *H01L 2924/181* (2013.01); *H01L 2924/19041* (2013.01); *H01L 2924/19043* (2013.01)

(58) Field of Classification Search
  USPC .......................... 438/106, 122; 257/675, 720
  See application file for complete search history.

(56) References Cited

U.S. PATENT DOCUMENTS

| | | | |
|---|---|---|---|
| 4,772,935 A | 9/1988 | Lawler et al. | |
| 4,796,080 A | 1/1989 | Phy | |
| 4,839,717 A | 6/1989 | Phy et al. | |
| 4,890,153 A | 12/1989 | Wu | |
| 5,327,325 A | 7/1994 | Nicewarner, Jr. | |
| 5,646,446 A | 7/1997 | Nicewarner, Jr. et al. | |
| 5,776,797 A | 7/1998 | Nicewarner, Jr. et al. | |
| 6,093,961 A | 7/2000 | McCullough | |
| 6,133,634 A | 10/2000 | Joshi | |
| 6,329,706 B1 | 12/2001 | Nam | |
| 6,424,035 B1 | 7/2002 | Sapp et al. | |
| 6,432,750 B2 | 8/2002 | Jeon et al. | |
| 6,449,174 B1 | 9/2002 | Elbanhawy | |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |
| 6,720,642 B1 | 4/2004 | Joshi et al. | |
| 6,731,003 B2 | 5/2004 | Joshi et al. | |
| 6,740,541 B2 | 5/2004 | Rajeev | |
| 6,756,689 B2 | 6/2004 | Nam et al. | |
| 6,774,465 B2 | 8/2004 | Lee et al. | |
| 6,777,800 B2 | 8/2004 | Madrid et al. | |
| 6,806,580 B2 | 10/2004 | Joshi et al. | |
| 6,818,982 B2* | 11/2004 | Kim .................... | H01L 23/3121 257/706 |
| 6,830,959 B2 | 12/2004 | Estacio | |
| 6,836,023 B2 | 12/2004 | Joshi et al. | |
| 6,867,481 B2 | 3/2005 | Joshi et al. | |
| 6,867,489 B1 | 3/2005 | Estacio | |
| 6,891,256 B2 | 5/2005 | Joshi et al. | |
| 6,891,257 B2 | 5/2005 | Chong et al. | |
| 6,893,901 B2 | 5/2005 | Madrid | |
| 6,943,434 B2 | 9/2005 | Tangpuz et al. | |
| 6,989,588 B2 | 1/2006 | Quinones et al. | |
| 6,992,384 B2 | 1/2006 | Joshi | |
| 7,022,548 B2 | 4/2006 | Joshi et al. | |
| 7,023,077 B2 | 4/2006 | Madrid | |
| 7,061,077 B2 | 6/2006 | Joshi | |
| 7,061,080 B2 | 6/2006 | Jeun et al. | |
| 7,081,666 B2 | 7/2006 | Joshi et al. | |
| 7,122,884 B2 | 10/2006 | Cabahug et al. | |
| 7,154,168 B2 | 12/2006 | Joshi et al. | |
| 7,157,799 B2 | 1/2007 | Noquil et al. | |
| 7,196,313 B2 | 3/2007 | Quinones et al. | |
| 7,199,461 B2 | 4/2007 | Son et al. | |
| 7,208,819 B2 | 4/2007 | Jeun et al. | |
| 7,215,011 B2 | 5/2007 | Joshi et al. | |
| 7,217,594 B2 | 5/2007 | Manatad | |
| 7,242,076 B2 | 7/2007 | Dolan | |
| 7,256,479 B2 | 8/2007 | Noquil et al. | |
| 7,268,414 B2 | 9/2007 | Choi et al. | |
| 7,271,497 B2 | 9/2007 | Joshi et al. | |
| 7,285,849 B2 | 10/2007 | Cruz et al. | |
| 7,315,077 B2 | 1/2008 | Choi et al. | |
| 7,332,806 B2 | 2/2008 | Joshi et al. | |
| 7,371,616 B2 | 5/2008 | Jereza | |
| 7,439,613 B2 | 10/2008 | Joshi et al. | |
| 7,501,702 B2 | 3/2009 | Joshi et al. | |
| 7,504,281 B2 | 3/2009 | Joshi | |
| 7,768,105 B2 | 8/2010 | Cruz et al. | |
| 7,838,340 B2 | 11/2010 | Cruz et al. | |
| 2005/0101161 A1 | 5/2005 | Weiblen et al. | |
| 2007/0001278 A1 | 1/2007 | Jeon et al. | |
| 2007/0114352 A1 | 5/2007 | Cruz et al. | |
| 2007/0267728 A1* | 11/2007 | Noquil ................ | H01L 23/3107 257/675 |
| 2008/0173991 A1* | 7/2008 | Cruz ................ | H01L 23/49524 257/676 |
| 2008/0277772 A1 | 11/2008 | Groenhuis | |
| 2009/0057855 A1 | 3/2009 | Quinones et al. | |
| 2010/0109135 A1 | 5/2010 | Jereza | |
| 2010/0164078 A1 | 7/2010 | Madrid et al. | |
| 2010/0258923 A1* | 10/2010 | Cruz ................ | H01L 23/49524 257/676 |
| 2010/0258924 A1 | 10/2010 | Cruz et al. | |
| 2011/0129963 A1 | 6/2011 | Kostiew et al. | |

FOREIGN PATENT DOCUMENTS

| | | |
|---|---|---|
| JP | 2008-300450 A | 12/2008 |
| WO | WO 2007-079399 A2 | 7/2007 |

* cited by examiner

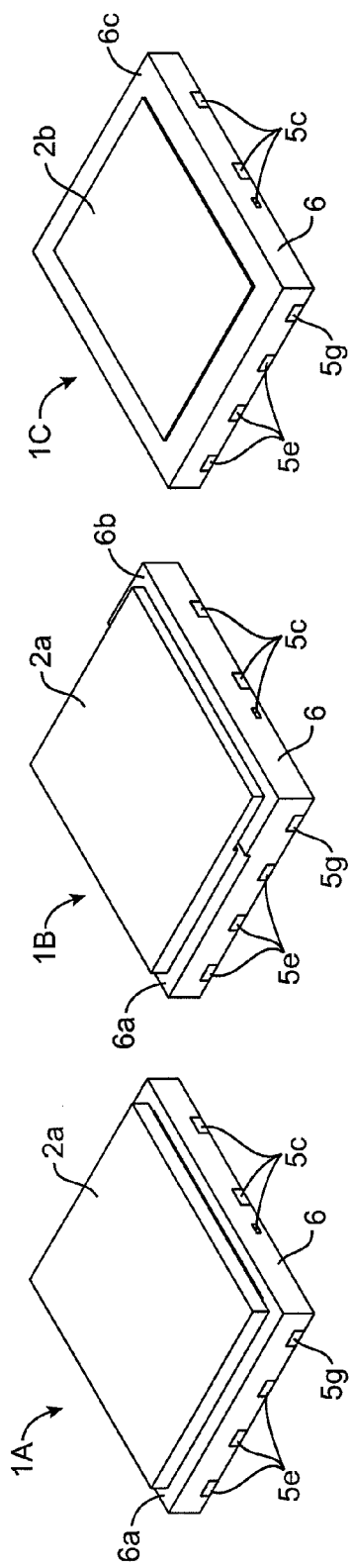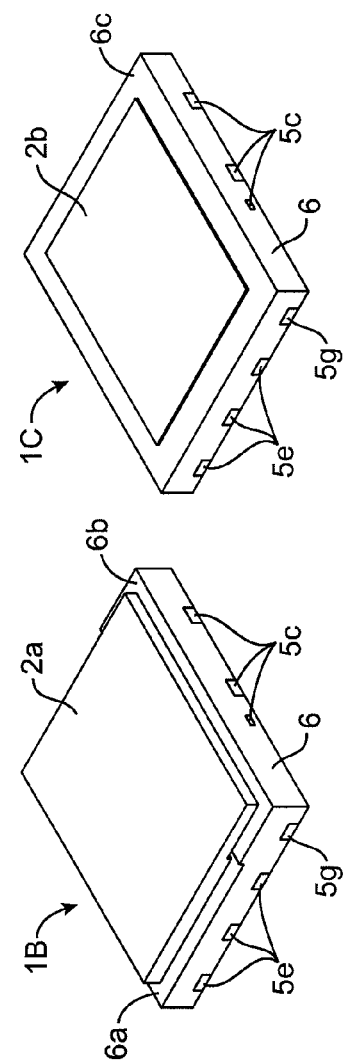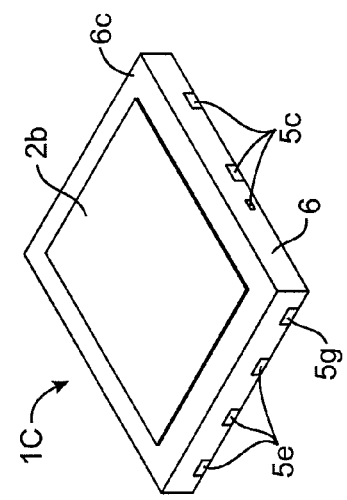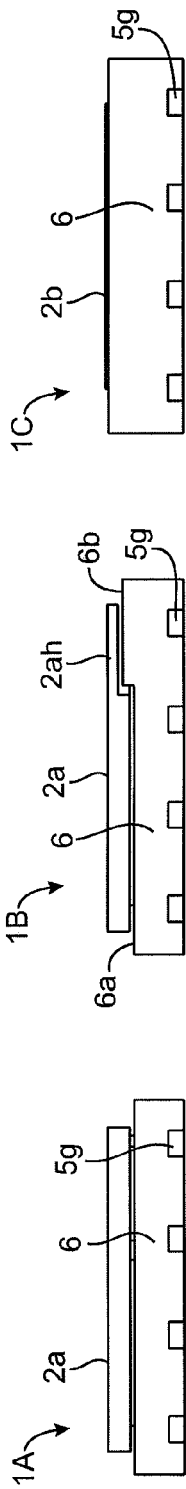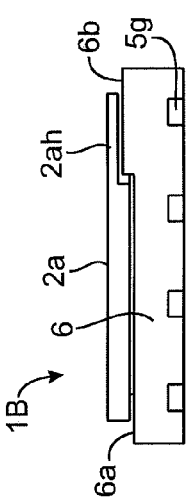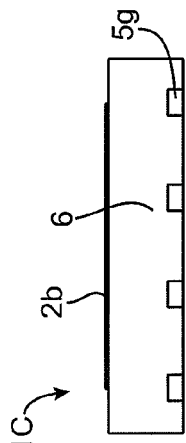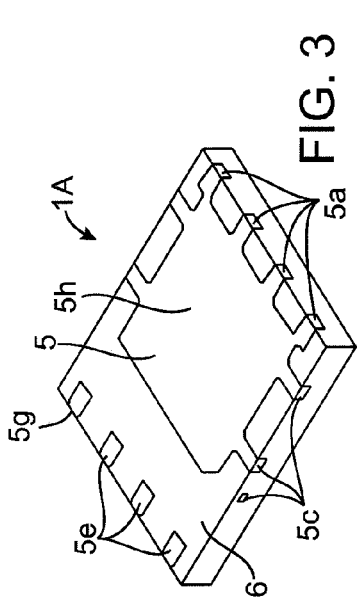

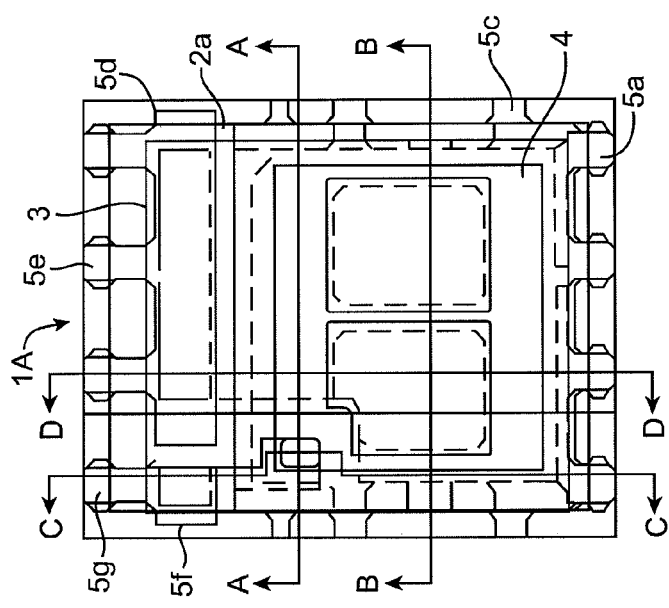
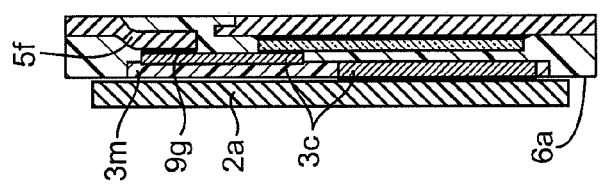
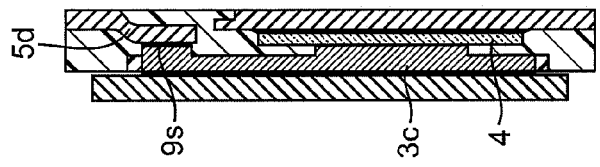
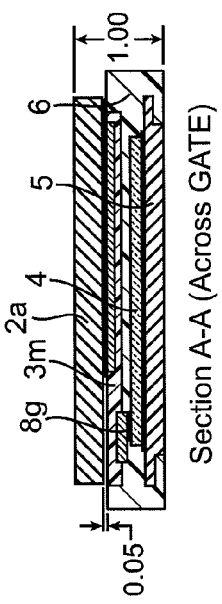
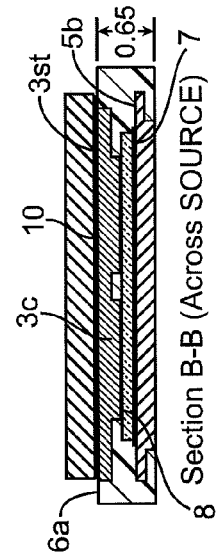

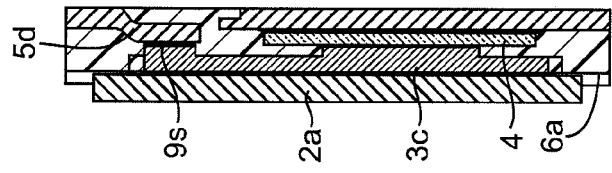
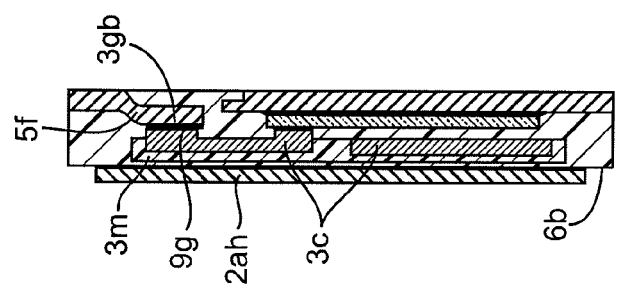
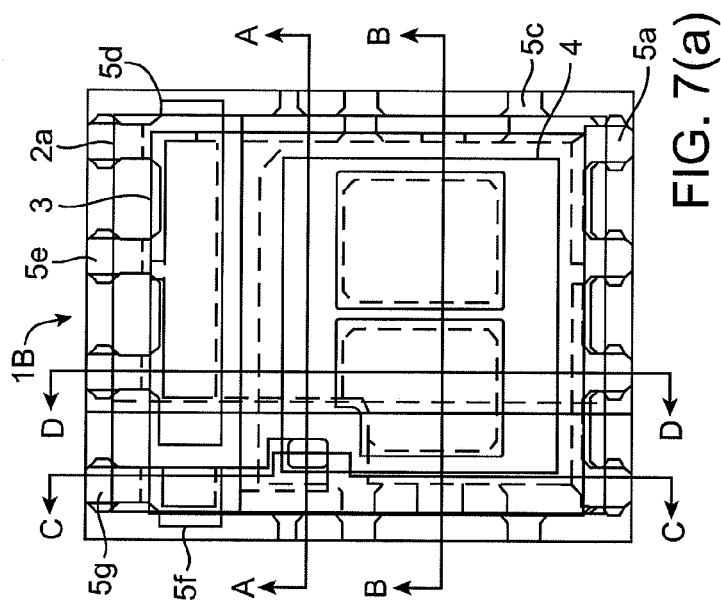
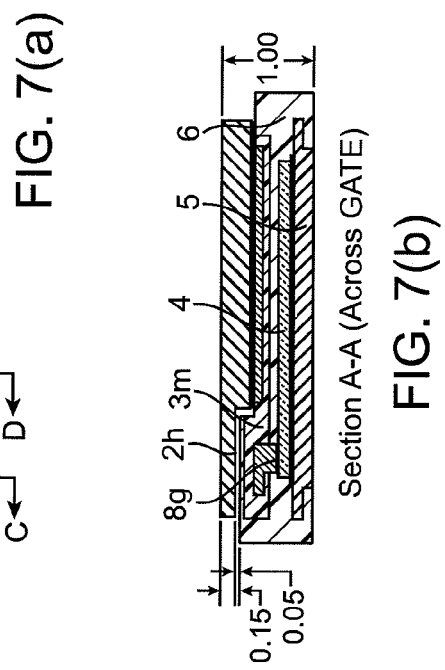
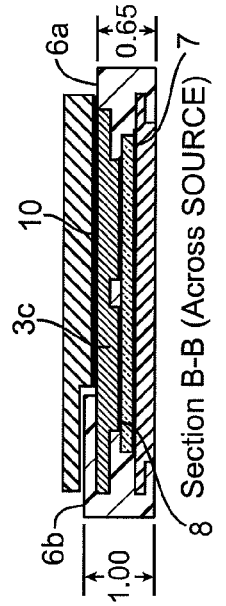

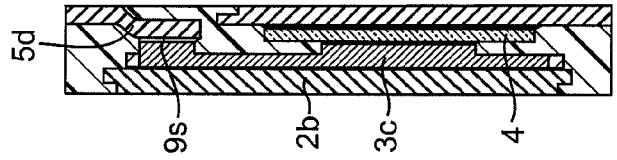
FIG. 9(e) Section D-D (Across GATE)
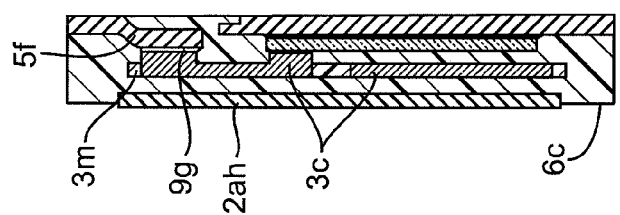
FIG. 9(d) Section C-C (Across GATE)
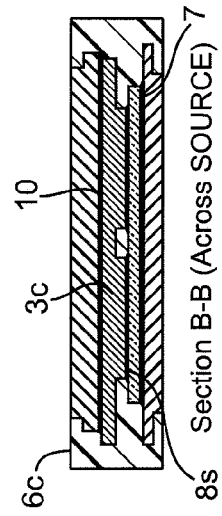
FIG. 9(c) Section B-B (Across SOURCE)
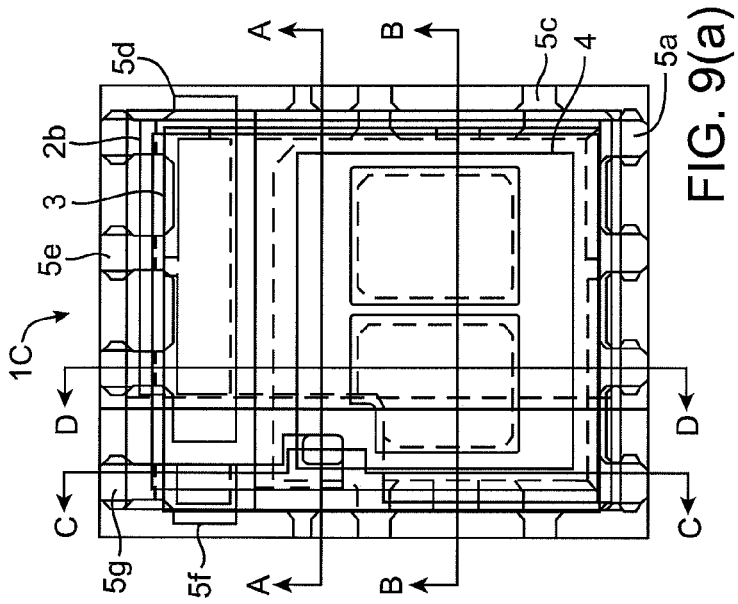
FIG. 9(a)
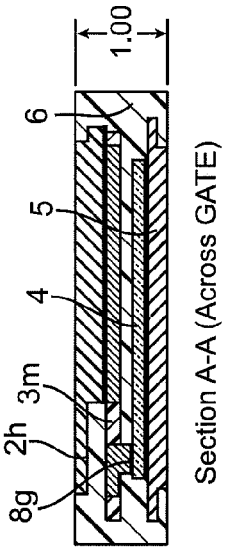
FIG. 9(b) Section A-A (Across GATE)

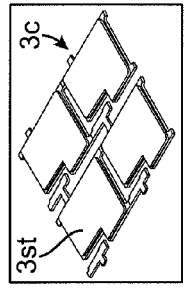
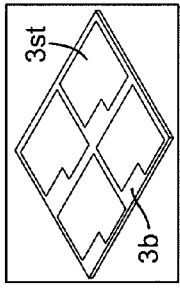
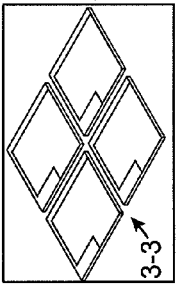
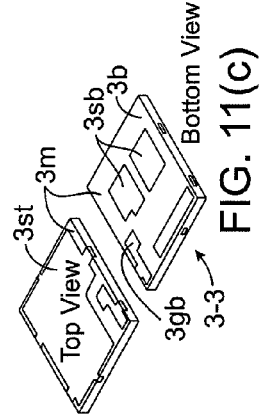
FIG. 10(c)-1 ⇨ FIG. 10(c)-2 ⇨ FIG. 10(c)-3 FIG. 11(c)
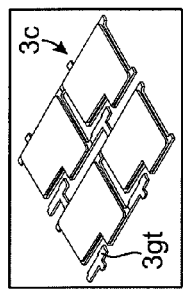
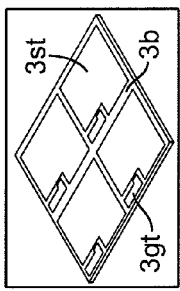
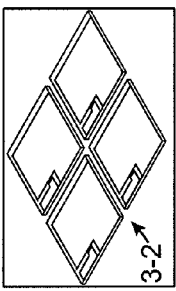
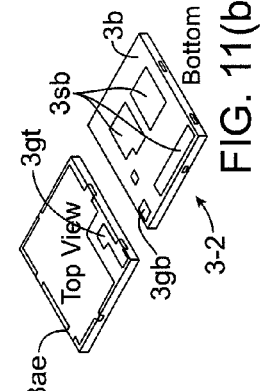
FIG. 10(b)-1 ⇨ FIG. 10(b)-2 ⇨ FIG. 10(b)-3 FIG. 11(b)
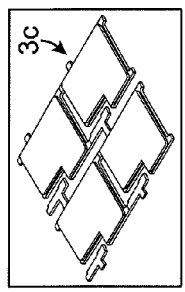
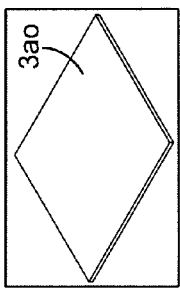
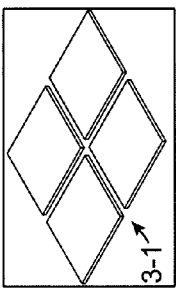
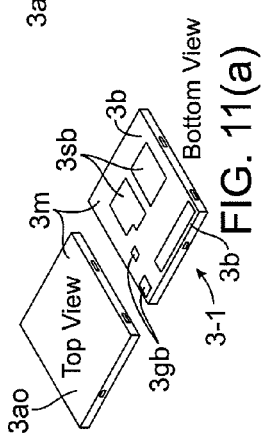
FIG. 10(a)-1 ⇨ FIG. 10(a)-2 ⇨ FIG. 10(a)-3 FIG. 11(a)

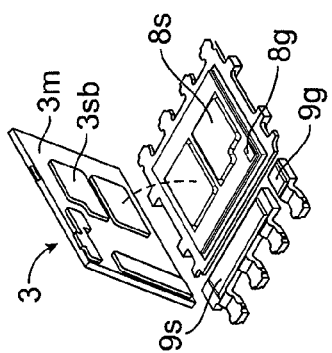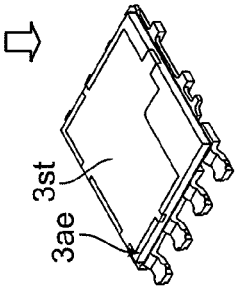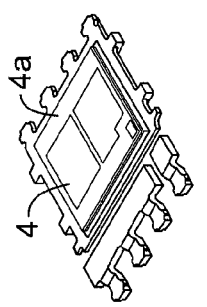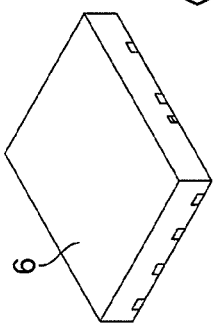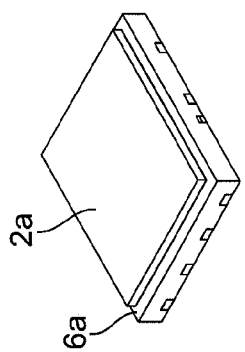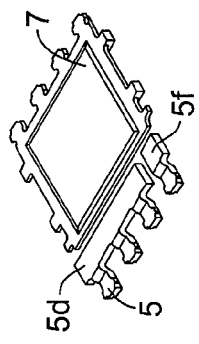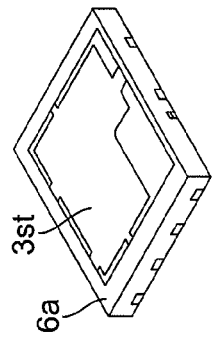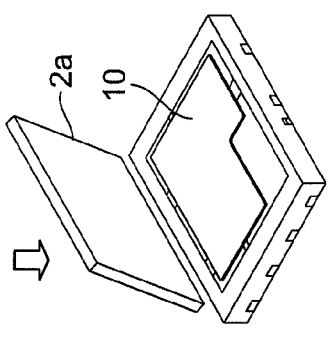

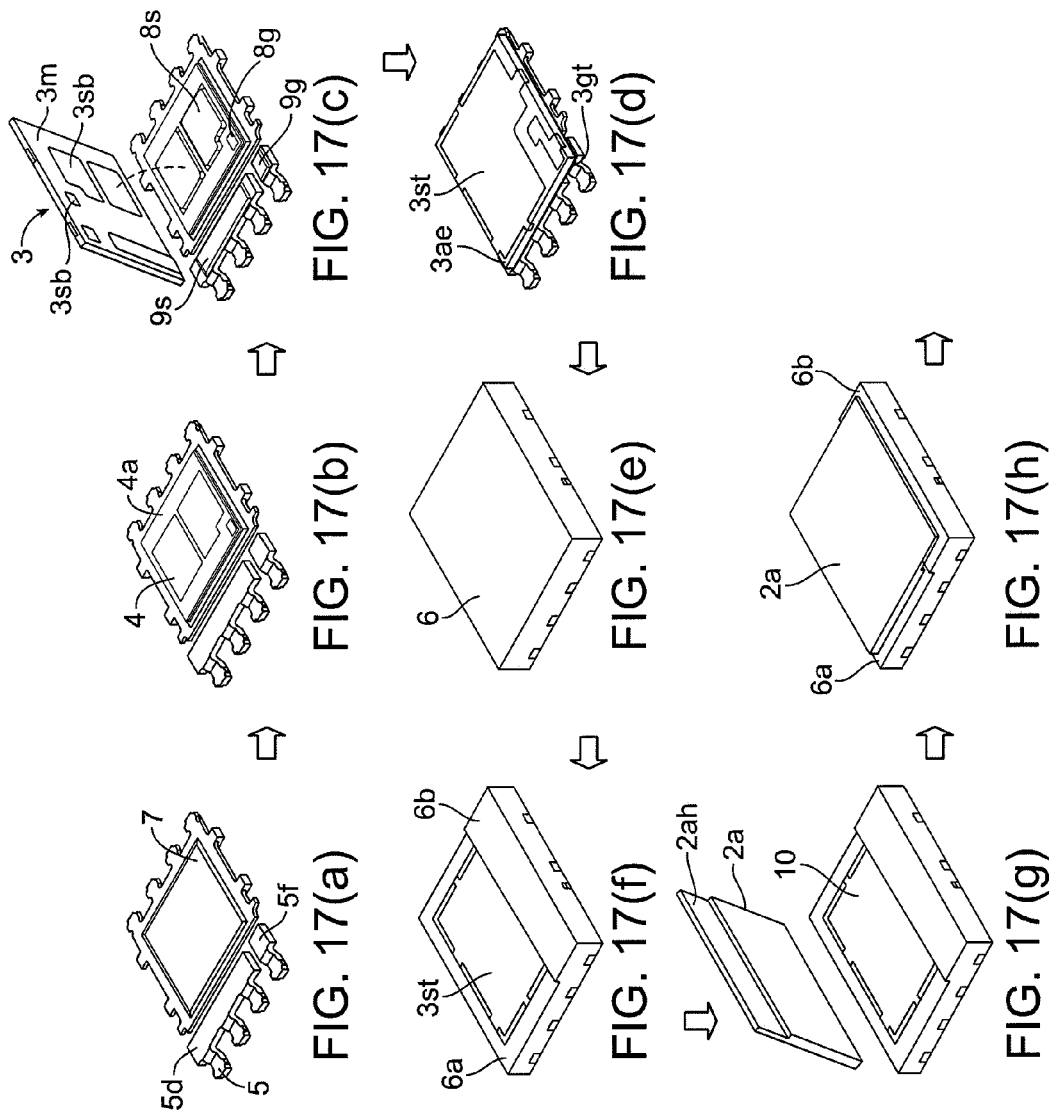

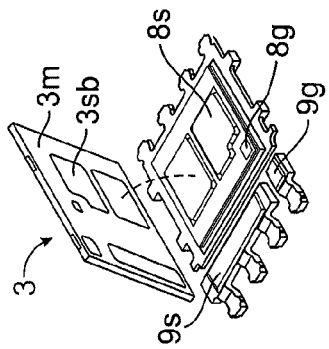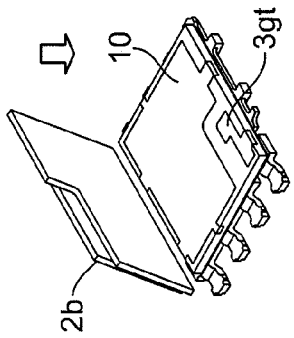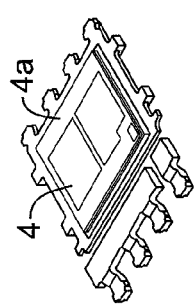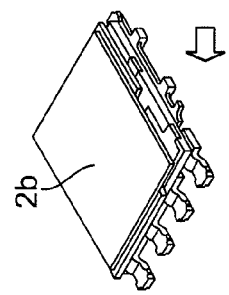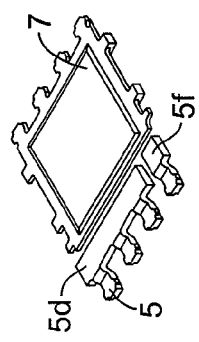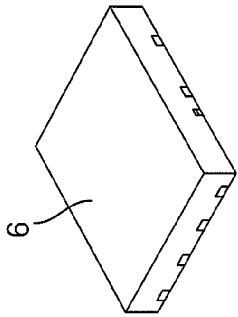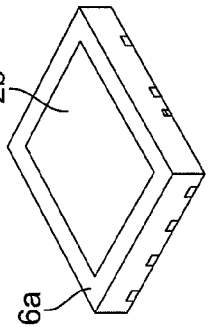

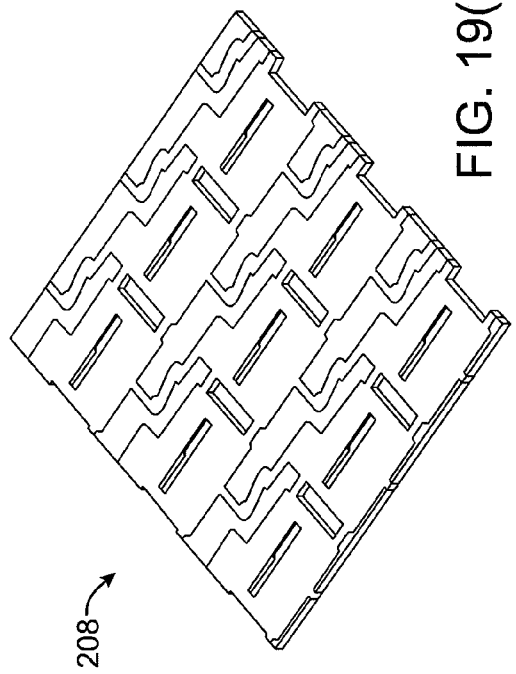
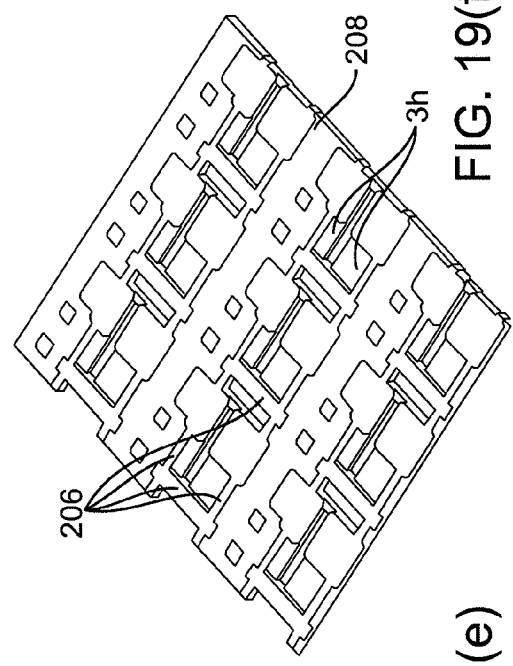
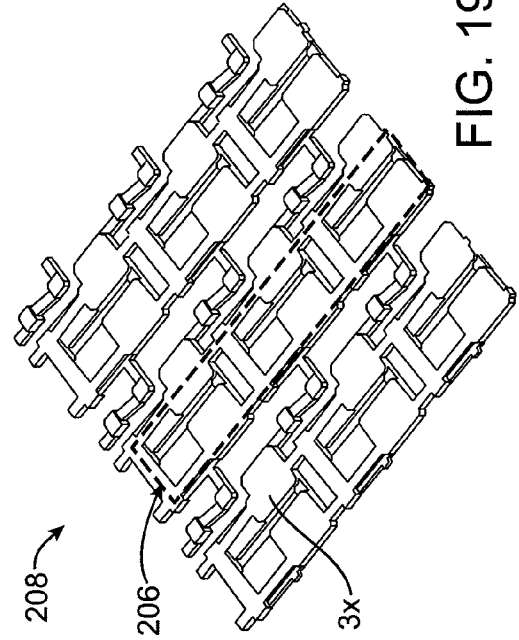

SEMICONDUCTOR DIE PACKAGE INCLUDING LOW STRESS CONFIGURATION

CROSS-REFERENCES TO RELATED APPLICATIONS

This application is a division of U.S. application Ser. No. 12/334,127, filed Dec. 12, 2008, now U.S. Pat. No. 8,106,501, and is a continuation-in-part of U.S. application Ser. No. 11/626,503, filed Jan. 24, 2007, now U.S. Pat. No. 7,768,105, the disclosures of which are incorporated herein by reference in their entirety.

BACKGROUND

Power semiconductor die packages are known and are used in computers and the like.

Such semiconductor die packages could be improved. For example, power semiconductor die packages generate a significant amount of heat. It would be desirable to improve upon semiconductor die packages so that they can dissipate more heat. Also, conventional semiconductor die packages are molded with a molded material. Having to directly expose a metal clip that is connected to the semiconductor die source contact pad to allow heat dissipation from the top side of the package presents challenges with respect to the metal clip design and the corresponding assembly process (particularly if the standard package dimensions are to be followed). The exposed metal clip stacked on top of the semiconductor die needs to be thick, and this can result in stress to the semiconductor die and the molding material. This can increase the likelihood of a package failure.

It would be desirable to provide for a semiconductor die package that can address these and other problems. Embodiments of the invention can address the above problems, and other problems, individually and collectively.

BRIEF SUMMARY

Embodiments of the invention relate to semiconductor die packages, methods for making semiconductor die packages, and systems comprising semiconductor die packages.

One embodiment of the invention is directed to a semiconductor die package comprising a semiconductor die and a molded clip structure comprising a clip structure and a first molding material covering at least a portion of the clip structure. The first molding material exposes an outer surface of the clip structure. The clip structure is electrically coupled to the semiconductor die. The semiconductor die package further comprises a leadframe structure comprising a die attach pad and a plurality of leads extending from the die attach pad. The semiconductor die is on the die attach pad of the leadframe structure. A second molding material covers at least a portion of the semiconductor die and the leadframe structure. The semiconductor die package also includes a heat slug and a thermally conductive material coupling the heat slug to the exposed surface of the clip structure.

One embodiment of the invention is directed to a method comprising: a) attaching a semiconductor die to a die attach pad of a leadframe structure; b) attaching a molded clip structure comprising a clip structure and a first molding material covering at least a portion of the clip structure, and exposing an outer surface of the clip structure to the semiconductor die; c) forming a second molding material around at least a portion of the semiconductor die and the leadframe structure; and d) attaching a heat slug to the exposed outer surface of the clip structure using a thermally conductive material.

Other embodiments of the invention are directed to electrical assemblies and methods for forming the same.

These and other embodiments of the invention are described in further detail below.

BRIEF DESCRIPTION OF THE DRAWINGS

FIGS. 1(a)-1(c) show three-dimensional top views of three different semiconductor die packages according to embodiments of the invention.

FIGS. 2(a)-2(c) show side views of the semiconductor die package embodiments shown in FIGS. 1(a)-1(c).

FIG. 3 shows a three-dimensional bottom view of a semiconductor die package according to the embodiments shown in FIGS. 1(a)-1(c).

FIG. 5(a) shows a top plan view of the semiconductor die package 1A shown in FIG. 1(a). Some internal components are shown.

FIGS. 5(b)-5(e) respectively show side cross-sectional views along lines A-A, B-B, C-C, and D-D in FIG. 5(a).

FIG. 7(a) shows a top plan view of the semiconductor die package 1B shown in FIG. 1(b). Some internal components are shown.

FIGS. 7(b)-7(e) respectively show side cross-sectional views along lines A-A, B-B, C-C, and D-D in FIG. 7(a).

FIG. 9(a) shows a top plan view of the semiconductor die package 1B shown in FIG. 1. Some internal components are shown.

FIGS. 9(b)-9(e) respectively show side cross-sectional views along lines A-A, B-B, C-C, and D-D in FIG. 9(a).

FIGS. 10(a)-1 to 10(a)-3 show images of precursors that are formed during the formation of molded clips according to an embodiment of the invention.

FIGS. 10(b)-1 to 10(b)-3 show images of precursors that are formed during the formation of molded clips according to another embodiment of the invention.

FIGS. 10(c)-1 to 10(c)-3 show images of precursors that are formed during the formation of molded clips according to another embodiment of the invention.

FIGS. 11(a)-11(c) show top and bottom perspective views of three different molded clip embodiments.

FIG. 16(a)-16(h) show perspective views of precursors that are formed during the formation of a semiconductor die package according to an embodiment of the invention.

FIG. 17(a)-17(h) show perspective views of precursors that are formed during the formation of a semiconductor die package according to an embodiment of the invention.

FIG. 18(a)-18(g) show perspective views of precursors that are formed during the formation of a semiconductor die package according to an embodiment of the invention.

FIG. 19(e) shows a top plan view of an array of clip structures according to an embodiment of the invention.

FIG. 19(f) shows a bottom perspective view of a molded clip structure according to an embodiment of the invention.

FIG. 19(g) shows a top perspective view of a molded clip structure according to an embodiment of the invention.

In the Figures, like numerals designate like elements, and the descriptions of some elements may not be repeated.

Exemplary dimensions are shown in the Figures. Embodiments of the invention are not limited to such exemplary dimensions.

DETAILED DESCRIPTION

One embodiment of the invention is directed to a semiconductor die package comprising a semiconductor die and a molded clip structure.

Figure 20:
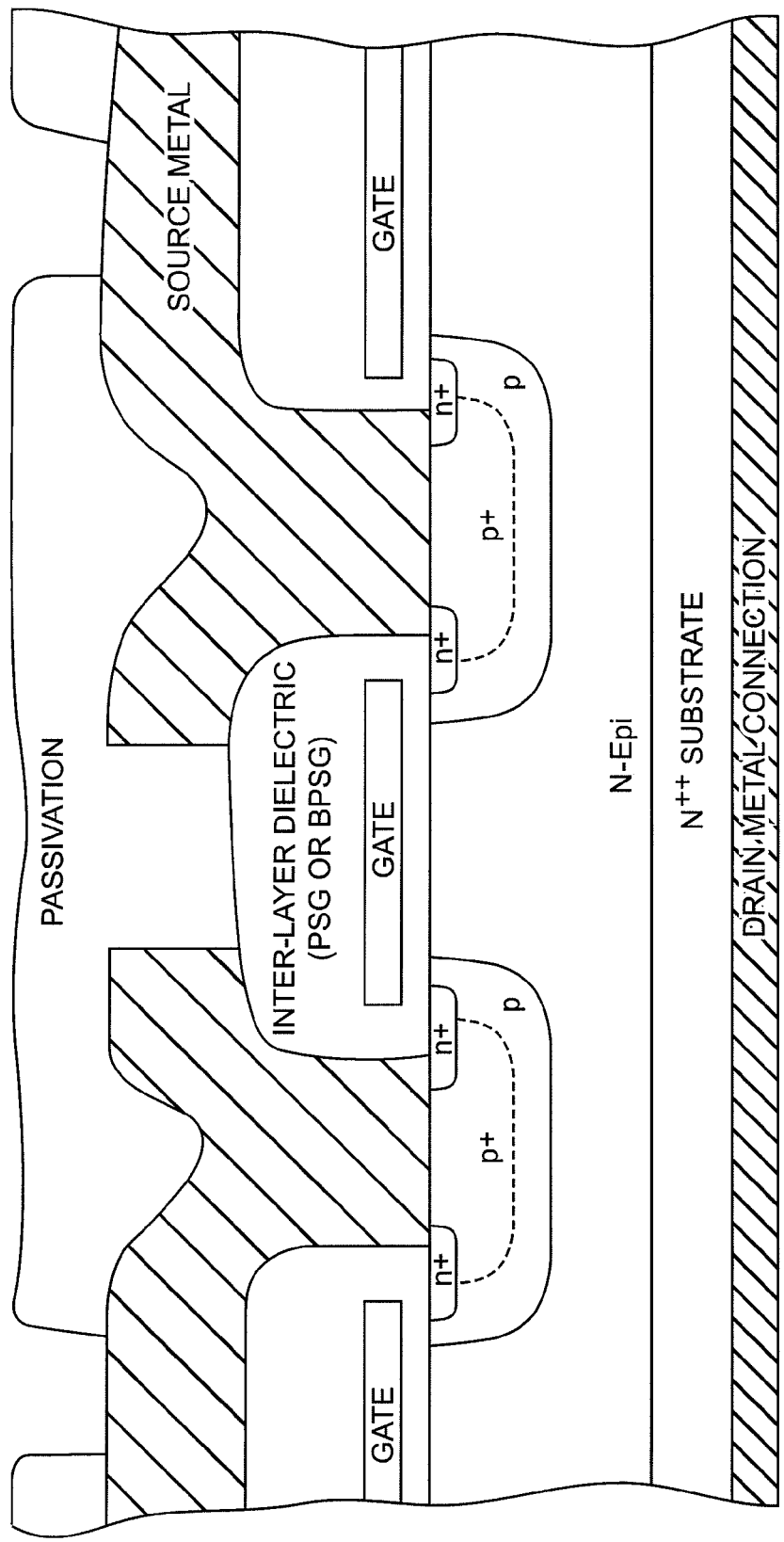
FIG. 20 shows a side cross-sectional view of a power MOSFET.

A semiconductor die in the semiconductor die package may comprise any suitable type of device, including a power MOSFET. While power MOSFETs are described in detail, any suitable vertical power transistor can be used in embodiments of the invention. Vertical power transistors include VDMOS transistors and vertical bipolar transistors. A VDMOS transistor is a MOSFET (an example of which is shown in FIG. 20) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. Other electrical devices such as vertical resistors, capacitors, etc. may also be used in embodiments of the invention. In embodiments of the invention, an input region can be at one surface of the semiconductor die, while an output region can be at the opposite surface of the semiconductor die.

The molded clip structure comprises a clip structure and a first molding material covering at least a portion of the clip structure. The clip structure may comprise a metal such as copper, and may be electrically coupled to the semiconductor die in the semiconductor die package. Surfaces of the first molding material may be substantially coplanar with surfaces of the clip structure.

The first molding material may comprise a material such as an epoxy material, and can expose an outer surface of the clip structure. During the process of manufacturing the semiconductor die package, the first molding material may initially cover the outer surface of the clip structure. The outer surface may be subsequently exposed using a material removal process such as a laser ablation process.

The contacts in the molded clip structure can define the shapes of the solder joints that couple the molded clip structure to the semiconductor die. This can result in less stressful, pre-defined solder joints at the gate and source contact areas of the semiconductor die. Other contacts in the molded clip can also define the shapes of solder joints that couple the molded clip to gate and source top-set lead posts in the leadframe structure.

The molded clip structure can be close to the semiconductor die in the semiconductor die package. In some embodiments of the invention, in order to prevent incomplete filling of a second molding material in the space between the two structures such as the molded clip structure and a semiconductor die, the molded clip structure is laser ablated at its bottom surface (see, e.g., FIG. 13) to provide space for the second molding material to fill the narrow clearances between the semiconductor die and the molded clip structure. After laser ablating the first molding material in the molded clip structure, the gate and source contact pads at the bottom side of the clip structure can protrude from other surfaces of the molded clip structure. This contact pad protrusion can promote vertical filleting of solder joints joining the molded clip structure to the semiconductor die.

The semiconductor die package further comprises a leadframe structure. The leadframe structure may include a die attach pad and leads extending from the die attach pad. The semiconductor die is mounted on the die attach pad of the leadframe structure using solder or some other conductive adhesive.

In some embodiments, the leadframe structure may include a drain lead structure, a gate lead structure, and a source lead structures. The drain lead structure may comprise a die attach pad and a plurality of leads extending from the die attach pad. The leadframe structure may also comprise a gate lead structure including a gate lead post and a gate lead extending from the gate lead post. It may also comprise a source lead structure including a source lead post, and a plurality of source leads extending substantially perpendicularly from the orientation of the source lead post.

The leadframe structure or the above-described clip structure may comprise any suitable material. For example, the leadframe structure and/or the clip structure may comprise a base metal such as copper, nickel etc. The base metal may be coated with a solderable material such as nickel or a non-oxidizing metal.

A second molding material can cover at least a portion of the semiconductor die and the leadframe structure. In some embodiments, a bottom exterior surface of the leadframe structure may be exposed through the second molding material. The second molding material may be the same or different than the first molding material. Because they are molded at separate times, an interface between the first and second molding materials may be present in the semiconductor die package.

The semiconductor die package also includes a heat slug and a thermally conductive material such as solder coupling the heat slug to the exposed surface of the clip structure. The heat slug can be attached so that it is an external or internal component in the semiconductor die package.

The heat slug may comprise a thermally and (optionally) electrically conductive material such as copper, aluminum, or alloys thereof. It may have a major surface that is shaped as a square, and may have a thickness of about 0.250 mm (or less) in some embodiments of the invention.

The thermally conductive material coupling the heat slug to the exposed surface of the clip structure may comprise any suitable material including a thermally conductive epoxy or solder (Pb-based or lead free).

The heat slug provides a number of advantages. First, the attached heat slug can form a top source contact for the semiconductor die package. This allows for greater design flexibility in case a source connection is to be formed at the top surface of a semiconductor die package. Second, the heat slug can make the semiconductor die package thicker, in the event that the semiconductor die package needs to conform to a predetermined specification. Third, the heat slug can also be an aesthetic crown for the semiconductor die package.

Embodiments of the invention also solve a number of problems. First, embodiments of the invention can eliminate or reduce the problem of compressive stress within the semiconductor die package. As noted above, an outer surface of the clip structure is not covered with either the second molding material or first molding material in some embodiments. In such embodiments, the outer surface of the clip structure is exposed during manufacturing using a non-mechanical, material removal process such as laser ablation. Second, in embodiments of the invention, a molded clip structure with a defined soldering area is placed between the two structures within the semiconductor die package. This reduces uncontrolled scattering of the solder joints and connections between the semiconductor die and the heat slug. Third, in embodiments of the invention, the semiconductor die, molded clip and heat slug can use the same solder metallurgy and solder reflow can take place simultaneously. This can result in a method that requires fewer processing steps and results in a less expensive package. Fourth, embodiments of the invention can be self-aligning, and there is no need to use jigs in the alignment of the semiconductor die, the molded clip and heat-slug. Fifth, in embodiments of the invention, it is possible to expose the outer exterior surface of the clip structure even when using dies of different sizes. Sixth, embodiments of the invention, which include an outer clip structure surface that is exposed through a first molding material, can use the same manufacturing equipment as semiconductor die packages which have an outer clip structure surface overmolded with a molding material. Seventh, the density of a clip structure array can be high and is independent of the leadframe structure pitch.

FIGS. 1(a), 2(a), and 3 show various views of a semiconductor die package 1A including a heat slug 2a at the top of the semiconductor die package 1A. The semiconductor die package 1A can be an MLP-type (micro lead package).

In some embodiments of the invention, the second molding material 6 initially covers an exterior surface of the clip structure in the semiconductor die package 1A. The second molding material 6 is then removed using a laser ablation process (or the like) to form a second molding material surface 6a. This exposes the exterior surface of the clip structure in the molded clip (not shown) that is within the semiconductor die package 1A. The heat slug 2a is then attached to the exposed exterior surface of the clip structure using a thermally and (optionally) electrically conductive material such as solder. The heat slug 2a can thereafter be a top source contact for the semiconductor die package 1A. As shown, the lateral dimensions of the heat slug 2a can be smaller than the lateral dimensions of the second molding material 6.

The semiconductor die package 1A includes a second molding material 6 under the heat slug 2a. The second molding material 6 may comprise an epoxy material, or any other suitable electrically insulating material. As shown, the second molding material 6 is under the heat slug 2a.

As shown in FIG. 1(a), a number of leads and tie bars may be exposed through the second molding material 6. The leads may include source terminals 5e, gate terminals 5g, as well as drain terminals 5a (see FIG. 3). The tie bars 5c in this example are at different sides of the semiconductor die package 1A as the leads 5a, 5e, and 5g. In this example, the ends of the leads 5a, 5e, and 5g are substantially coextensive with the lateral surfaces of the second molding material 6. In other embodiments of the invention, the leads 5a, 5e, and 5g may extend past the lateral surfaces of the second molding material 6.

FIG. 3 shows a bottom perspective view of the semiconductor die package 1A shown in FIGS. 1(a) and 2(a). As shown in FIG. 3, the bottom surface 5h of the leadframe structure 5 is exposed through the second molding material 6. The bottom surface 5h is also substantially coplanar with the bottom surface of the second molding material 6 as well as the bottom surfaces of the leads 5a, 5e, and 5g. It also occupies a substantial portion (e.g., greater than 50%) of the lateral surface area of the bottom of the semiconductor die package 1A, and is integral with the drain leads 5e. The bottom surface 5h can be mounted directly on to a circuit substrate or the like. It may form a drain connection for a drain region in a semiconductor die in the semiconductor die package 1A.

Figure 4:
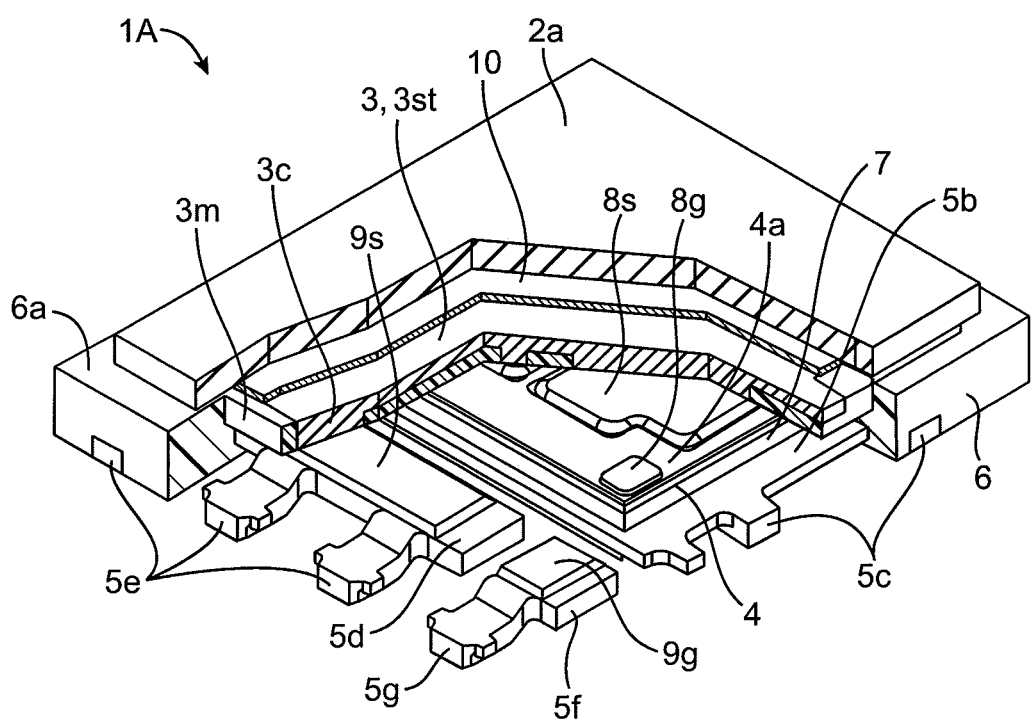
FIG. 4 shows a three-dimensional cutaway top view showing the different components in the semiconductor die package shown in FIG. 1(a).

FIG. 4 shows a three-dimensional, cutaway top view showing the different components in the semiconductor die package 1A. As shown in FIG. 4, a molded clip structure 3 is between the external heat slug 2a and a semiconductor die 4.

The molded clip structure 3 may comprise any suitable components and may include any suitable configuration. For example, the molded clip structure 3 may comprise a clip structure 3c, and a first molding material 3m at least partially covering the clip structure 3c. The molded clip structure 3 may also have a thickness of about 0.25 mm (or less), and may also have lateral dimensions of about 4.30 mm by about 5.10 mm (or less).

The clip structure 3d may have any suitable configuration and/or materials. For example, if the semiconductor die package 1A is a power MOSFET package, the clip structure 3 may comprise a source clip structure 3st and a gate clip structure (not shown), which is electrically isolated from the source clip structure 3st. In the molded clip structure 3, an exterior surface of the source clip structure 3st is exposed through the first molding material 3m. Solder 10 may be used to electrically and mechanically couple the heat slug 2a and the source clip structure 3st. Solder 10 may comprise lead-based (e.g., PbSn) or lead-free solder. It may be deposited as discrete joints, or may be in the form of a layer of solder.

The semiconductor die 4 may be mounted on a die attach pad 5b of the leadframe structure 5. Solder 7 may be between the semiconductor die 4 and the leadframe structure 5. Tie bars 5c may extend from the die attach pad 5b. The second molding material 6 may cover at least a portion of the semiconductor die 4 and the leadframe structure 5. An exterior surface 6a of the second molding material 6 may be substantially coplanar with the exterior surface of the source clip structure 3st.

The semiconductor die 4 shown in FIG. 4 also has a passivation layer (e.g., comprising an insulator such as polyimide or silicon oxide) 4a thereon. Regions of the semiconductor die 4 that are not covered by the die passivation layer 4a may be covered with solder. Such regions may include a source region covered by a source solder structure 8s and a gate region covered by a gate solder structure 8g. The source solder structure 8s may be coupled to the source clip structure 3st in the clip structure 3c, which may in turn be coupled to source solder 9s on a source lead post 5d. Source leads 5e may extend from the source lead post 5d. The gate solder structure 8g may be coupled to a gate clip structure in the clip structure 3c, which may in turn be coupled to gate solder 9g on the gate lead post 5f. A gate lead 5g may extend from the gate lead post 5f.

The molded clip 3 can define the solder joints with the semiconductor die 4 in such a manner that it forms less stressful, pre-defined solder joints at the gate region and source region of the semiconductor die 4. The exposed surfaces of the clip structure 3c in the molded clip 3 can also define the shapes of the solder joints formed with the source and gate lead posts 5d and 5f of the leadframe structure 5.

As shown in FIG. 4, in the semiconductor die package 1A, the stack of components including the heat slug 2a, the semiconductor die 4, and the leadframe structure 5, can form a very efficient heat transfer path, since there is little molding material that would impede the transfer of heat from the semiconductor die 4 to the surrounding environment. Also, the solder that interconnects these components may be the same (or different) and may be reflowed at the same time (or different times).

FIG. 5(a) shows a top plan view of the semiconductor die package 1A shown in FIG. 1. FIGS. 5(b)-5(e) show side cross-sectional views along lines A-A (across a gate region), B-B (across source region), C-C (across a gate region), and D-D (across source region), respectively. The elements shown in FIGS. 5(a)-5(e) are described above and their descriptions need not be repeated here. Exemplary dimensions (in mm) are shown in FIGS. 5(b) and 5(c). Embodiments of the invention can have dimensions that are greater than or less than the illustrated dimensions.

Another semiconductor die package 1B according to another embodiment of the invention is shown in FIGS. 1(b), 2(b), 3, and 6. The semiconductor die package 1B has similar components as in the previously described semiconductor die package 1A in FIGS. 1(a), 2(a), and 4. Accordingly, descriptions of similar components are not repeated herein.

Figure 6:
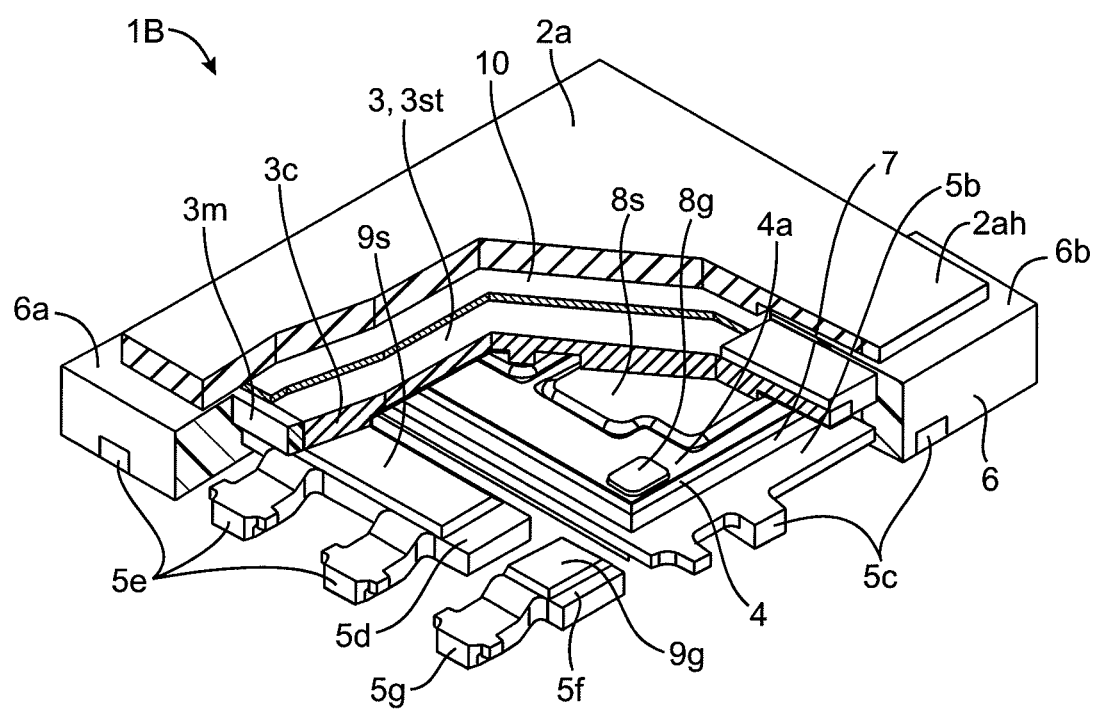
FIG. 6 shows a three-dimensional cutaway top view showing the different components in the semiconductor die package shown in FIG. 1(b).
Figure 8:
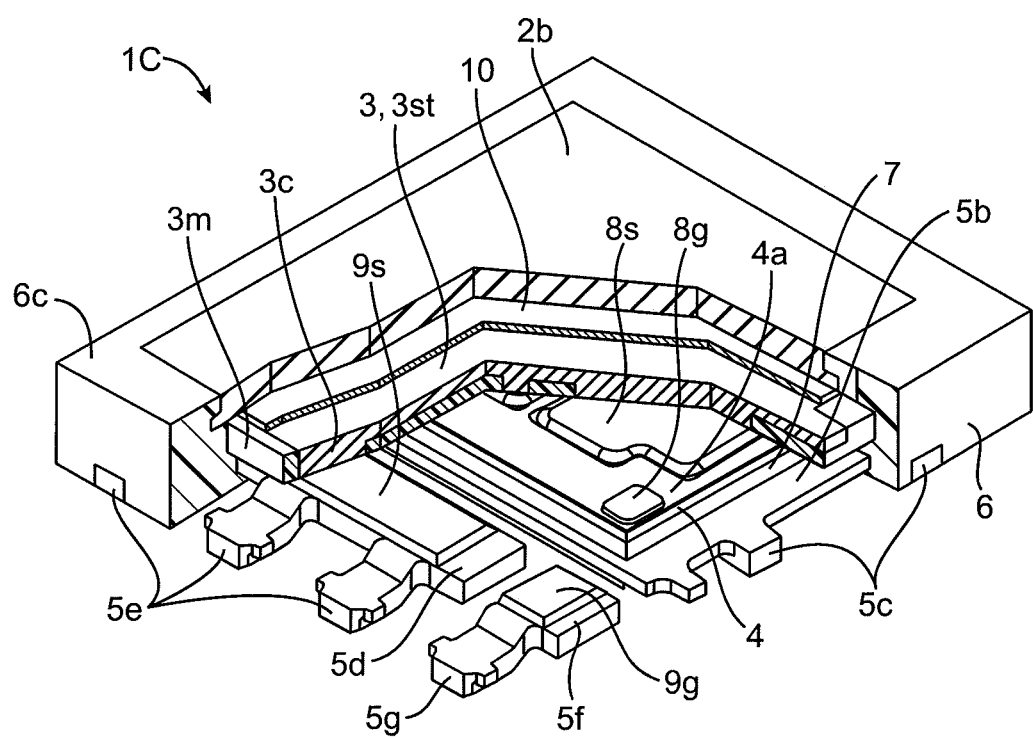
FIG. 8 shows a three-dimensional cutaway top view showing the different components in the semiconductor die package 1C shown in FIG. 1(c).

However, in the semiconductor die package 1B in FIGS. 1(b), 2(b), and 6, the second molding material 6 has two different portions with two different thicknesses, whereas in the semiconductor die package 1A, the second molding material 6 has only one thickness at edge regions of the package 1A. In the semiconductor die package 1B in FIG. 1(b), these two different thicknesses are exemplified by surface 6a and surface 6b in FIGS. 1(b) and 2(b). The thicker portion including surface 6b has some of the second molding material 6 covering a gate clip structure (not shown) so that it is electrically isolated from the heat slug 2a, which is mechanically and electrically connected to the source clip structure (not shown).

Another difference between the semiconductor die package 1A shown in FIG. 1(a) and the semiconductor die package 1B shown in FIG. 1(b) is that the heat slug 2a has a half-etched (or partially etched) region 2a h to provide space for the higher second molding material surface 6b. The heat slug 2a can be etched using any suitable etching process.

As shown in FIG. 2B, the half-etched heat slug 2a and the second molding material 6 are cooperatively structured with each other. There is a space between the top surface 6b of the second molding material 6 and the half-etched part 2a h. It is noted that in other embodiments, the space need not be present.

FIG. 7(a) shows a top plan view of the semiconductor die package 2A shown in FIG. 1(b). FIGS. 7(b)-7(e) show side cross-sectional views along lines A-A, B-B, C-C, and D-D, respectively. The elements shown in FIGS. 7(a)-7(e) are described above. Exemplary dimensions (in mm) are shown in FIGS. 7(b) and 7(c). Embodiments of the invention can have dimensions that are greater than or less than the illustrated dimensions.

Another semiconductor die package 1C according to another embodiment of the invention is shown in FIGS. 1(c), 2(c), 3, and 8. The semiconductor die package 1B has similar components as in the previously described semiconductor die package 1A in FIGS. 1(a), 2(a), and 4. Accordingly, descriptions of similar components are not repeated herein.

However, the heat slug 2b for the semiconductor die package 1C is designed with peripheral half-etched or stamped regions at its topside for mold locking, and a predefined half-etched area at its bottom correspondingly for gate isolation. Put another way, the heat slug 2b is thinner above the gate region in the semiconductor die in the semiconductor die package than above the source region in the semiconductor die in the semiconductor die package. Also, the edges are thinner than central portions of the heat slug 2b so that the second molding material 6 can lock to the heat slug 2b. Thus, unlike the previously described packages 1A and 1B, in the package 1C, the second molding material 6 surrounds the edges of the heat slug 2a.

FIG. 9(a) shows a top plan view of the semiconductor die package 1A shown in FIG. 1. FIGS. 9(b)-9(e) show side cross-sectional views along lines A-A, B-B, C-C, and D-D, respectively. The elements shown in FIGS. 9(a)-9(e) are described above. Exemplary dimensions (in mm) are shown in FIG. 9(b). Embodiments of the invention can have dimensions that are greater than or less than the illustrated dimensions.

Embodiments of the invention also include novel and unique methods for making semiconductor die packages. For example, as will be described in greater detail below, in some embodiments (e.g., the package 1C shown in FIG. 1(c)), after assembling the semiconductor die and a stack of metallic components (including a leadframe structure, a clip structure, and a heat slug) together, the combination is molded with the second molding material 6. After molding, surfaces of the leadframe structure terminals 5a, 5g and 5e are exposed through the second molding material 6 at the bottom of the semiconductor die package. Any overmolded portion at the top of the semiconductor die package can be ablated using a laser to expose the top side surface of the heat slug 2b down to package surface 6c. The ablated mold compound and exposed heat slug 2b form a coplanar surface 6c.

Also, in embodiments of the invention, the heat slug and/or the molded clip assembly can be designed to isolate gate current associated with the gate region in the semiconductor die, with source current. This prevents shorting of the gate clip structure in the clip structure with the heat slug, which is coupled to the source region in the semiconductor die. For example, the semiconductor die package 1A in FIG. 1(a) has a gate isolation feature built into the molded clip structure. In the semiconductor die package 1B in FIG. 1(b), a gate isolation feature is produced by selective ablation of the second molding material 6b. The surface 6b of the second molding material 6 is higher than the surface 6a of the second molding material. This is done in order to hide the gate contact pad in the gate structure of the clip structure. In the semiconductor die package 1C in FIG. 1C, a gate isolation feature is designed by making a half-etched metal clearance in the heat slug above the exposed gate contact pad of the molded clip. The second molding material can fill this space during the final package molding process. This is accomplished by completely molding the stack with the second molding material 6 and then followed by a laser ablation step to partly remove the second molding material 6 while allowing exposure of the heatslug 2b such that the second molding material on the edges of the heat slug 2a is coplanar to it.

FIGS. 10(a)-1 to 10(a)-3, 10(b)-1 to 10(b)-3, and 10(c)-1 to 10(c)-3 show process flows for making molded clip structures according to embodiments of the invention. As shown in FIGS. 10(a)-1 to 10(a)-3, 10(b)-1 to 10(b)-3, and 10(c)-1 to 10(c)-3, a clip structure 3c is first obtained in embodiments of the invention. Each clip structure 3c may include a gate clip structure 3gt and a source clip structure 3st. The clip structures 3c in FIGS. 10(a)-1 to 10(a)-3, 10(b)-1 to 10(b)-3, and 10(c)-1 to 10(c)-3 are respectively used in the molded clip structures 3-1, 3-2, and 3-3 shown in FIGS. 11(a)-11(c).

In FIGS. 10(a)-2, 10(b)-2, and 10(c)-2, the clip structures 3c are then molded with the first molding material 3ao. In FIG. 10(a)-2, the clip structure 3c is overmolded with the first molding material 3ao at its top surface, while in FIGS. 10(b)-2 and 10(c)-2, the clip structures 3c are not overmolded at their top surfaces.

Portions of the first molding material of the clip structures 3c are then laser ablated at their bottom surfaces (see surface 3b in FIGS. 11(a)-11(c)) so that the gate and source contact pads 3gb and 3sb protrude from the bottom surfaces of the first molding material.

Then, as shown in FIGS. 10(a)-3, 10(b)-3, and 10(c)-3, the arrays of molded clip structures are then singulated by a cutting process such as sawing or laser cutting. The resulting molded clip structures 3-1, 3-2, and 3-3 are shown in FIGS. 11(a)-11(c).

FIG. 11(a) shows a molded clip structure 3-1 with a bottom first molding material surface 3b exposing the clip gate and source contact pads 3gb, 3sb. These pads 3gb, 3sb can be used for connections to the semiconductor die and leadframe structure in the semiconductor die package. Top surface 3ao of the first molding material 3m covers (i.e., overmolds) an outer surface of the clip structure. This molded clip structure 3-1 can be formed by placing tape against surfaces of the clip structure 3c that are not to be covered with the first molding material 3m.

FIG. 11(b) shows a molded clip structure 3-2. Top gate and source contact pads 3gt and 3st are exposed by and are substantially coplanar with the top surface 3ae of the molding material 3m. Bottom contact pads 3gb and 3sb are exposed by the surface 3b of the first molding material 3m. The pads 3gb and 3sb may be exposed through, protrude from, and/or substantially coplanar with the surface 3b of the first molding material 3m.

The molded clip structure 3-2 can be produced by fully clamping the clip structure 3c during the molding process. Molded clip structure 3-2 does not require the use of a tape assisted molding process. As explained above, the top exposed source pad 3st can be used for a heat slug connection during the assembly of the semiconductor die package.

FIG. 11(c) shows a molded clip structure 3-3 with a first molding material 3m having two opposing surfaces 3ae and 3b that expose clip structure surfaces. Top surface 3ae exposes source contact pad 3st for a heat slug connection.

The gate contact pad in the clip structure is not exposed by the top surface 3ae as it is half-etched at its topside. Bottom surface 3b exposes gate and source contact pads 3gb, 3sb for connection to a semiconductor die and leadframe structure connections. Molded clip structure 3-3 may or may not use a leadframe tape during clip structure molding.

Figure 12:
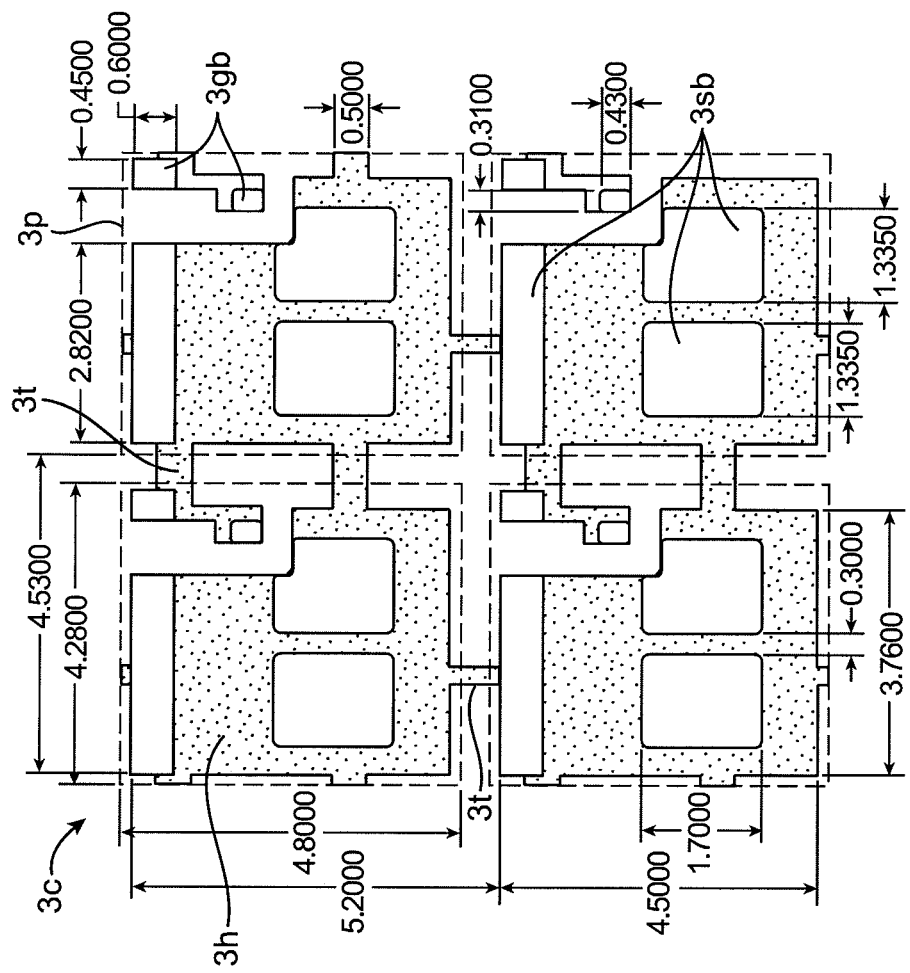
FIG. 12 shows a two dimensional array of clip structures.

FIG. 12 shows an array of clip structures 3c connected to one another by half-etched tie bars 3t. The bulk of the clip structure array is half-etched metal 3h. The full metal areas are the contact pads 3gb and 3sb to be used for soldering connections with previously described semiconductor die 4 and the leadframe structure 5 during final package assembly. Exemplary dimensions (in mm) are shown in FIG. 12. Embodiments of the invention can have dimensions that are greater than or less than the illustrated dimensions.

Referring to FIGS. 11(b) and 11(c), the molding process for the molded clips 3-2 and 3-3 can involve full clamping of the full metal contact areas 3gb and 3sb exposing them at the bottom surface 3b. The other side of the clip structure 3c can be exposed by the top surface 3ae of the molding material 3m whereby it will be used for a soldering connection with the previously described heat slug. The half-etched areas can be filled in with the first molding material 3m.

Referring to FIG. 11(a), the molding process for molded clip 3-1 can include clamping of the array periphery to allow an overmold on the clip structure to form top surface 3ao. The clip structure 3c can use tape in the overmolding process. The thickness of the overmolded first molding material 3m could be greater or less than 0.1 mm.

Figure 13:
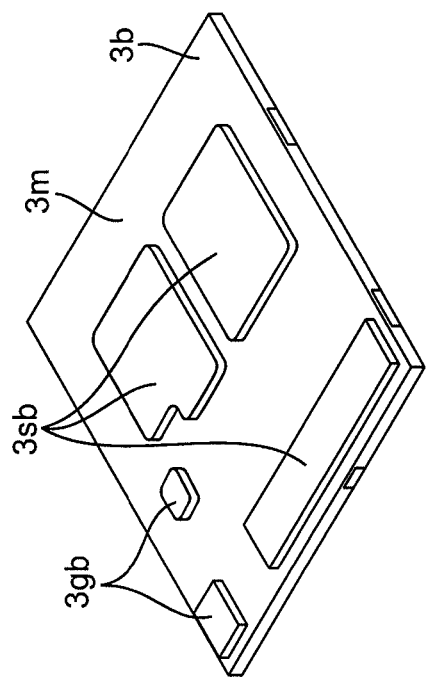
FIG. 13 shows a three dimensional perspective view of a clip structure according to an embodiment of the invention.

With respect to FIG. 13, the protruding gate and source contact pads 3gb and 3sb can promote vertical filleting of the solder 8g and 8s during the clip structure attach process. The molding material 3m that is removed during the laser ablation process can provide space for the second molding material 6 during encapsulation of the components of the semiconductor die package.

Figure 14A:
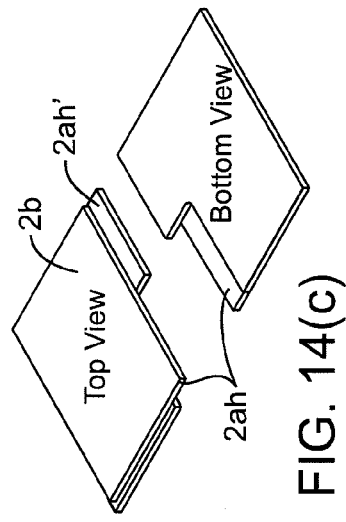
FIGS. 14(a)-14(c) show three different heat slugs according to embodiments of the invention.
Figure 14B:
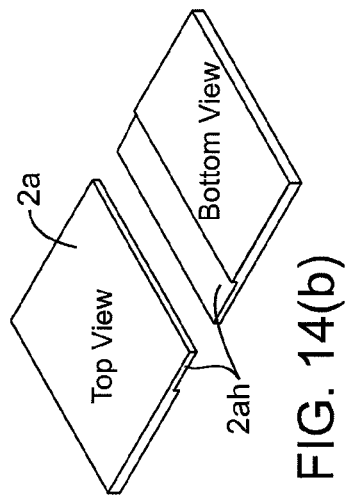
Figure 14C:
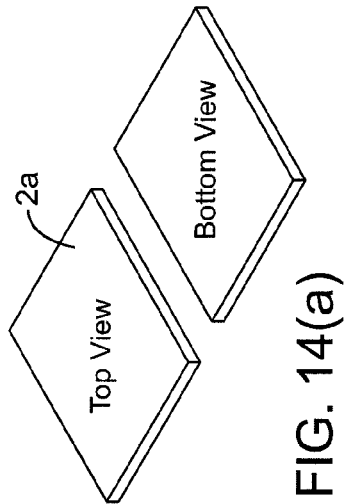
Figure 15A:
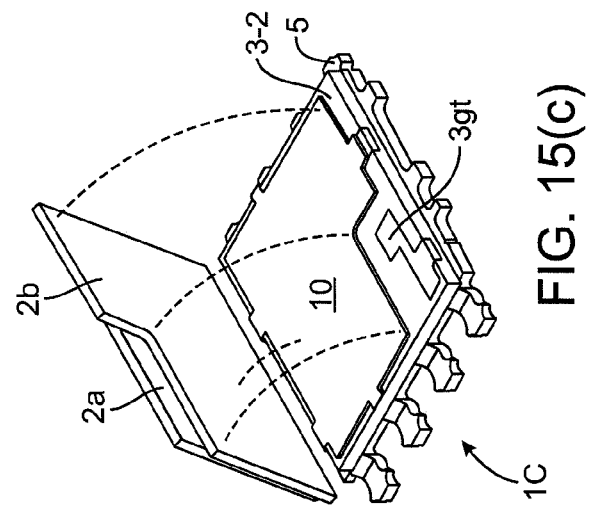
FIGS. 15(a)-15(c) show perspective views of three semiconductor die packages with heat slugs in open positions.
Figure 15B:
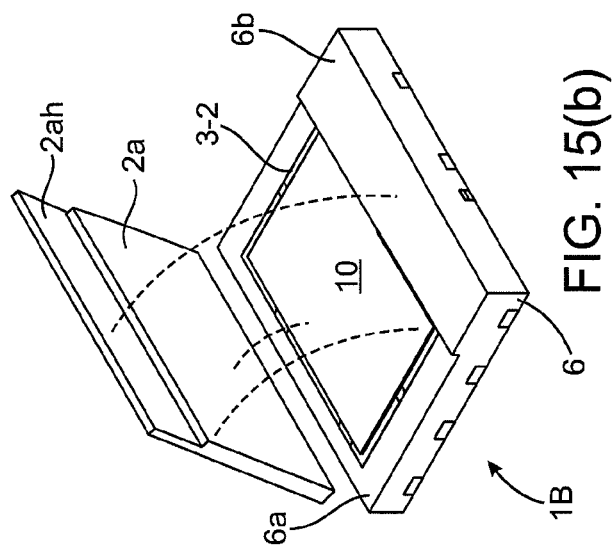
Figure 15C:
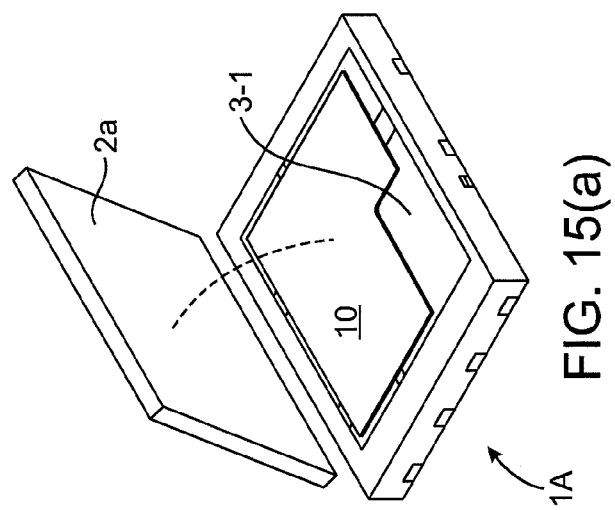
Figure 19A:
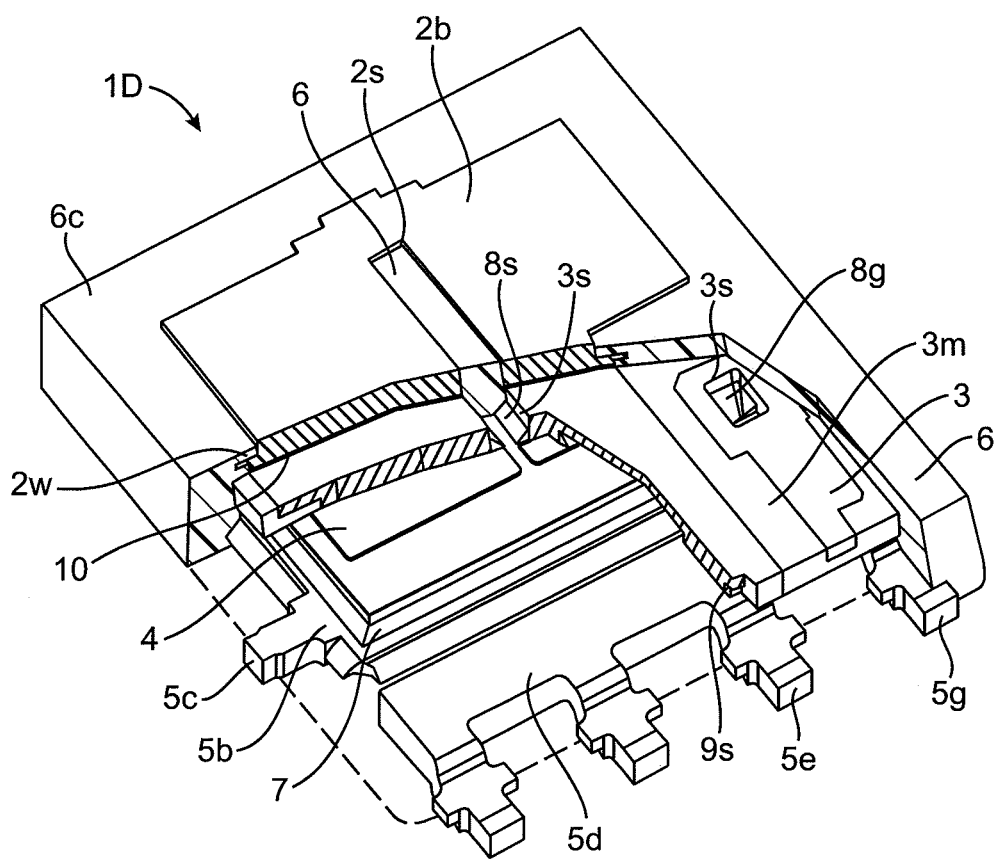
FIG. 19(a) shows a three-dimensional cutaway view of another semiconductor die package embodiment.
Figure 19B:
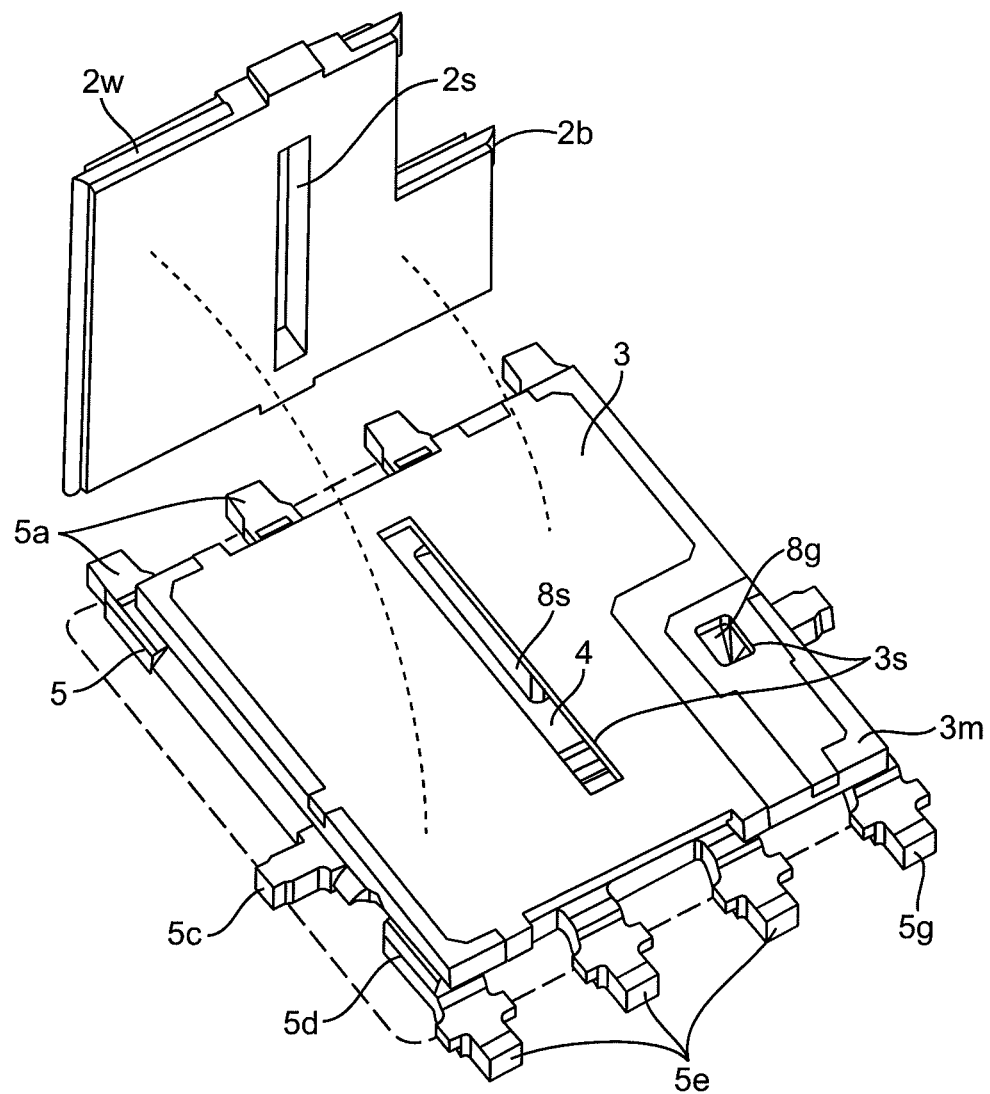
FIG. 19(b) shows a three dimensional view of a semiconductor die package without a molding material and with the clip structure.
Figure 19D:
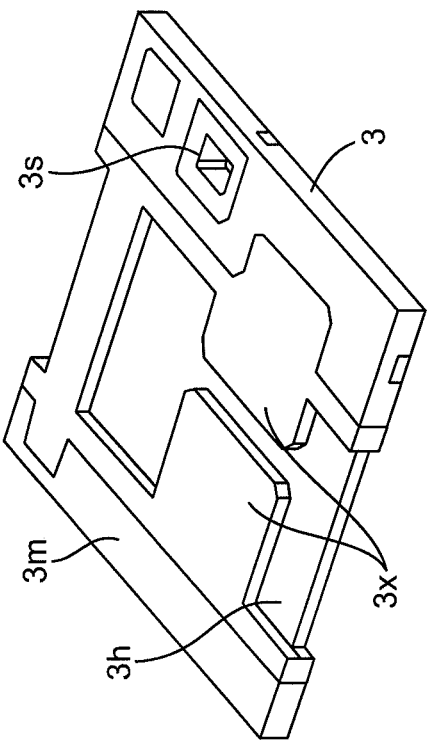
FIG. 19(d) shows a top perspective view of a molded clip structure according to an embodiment of the invention.
Figure 19C:
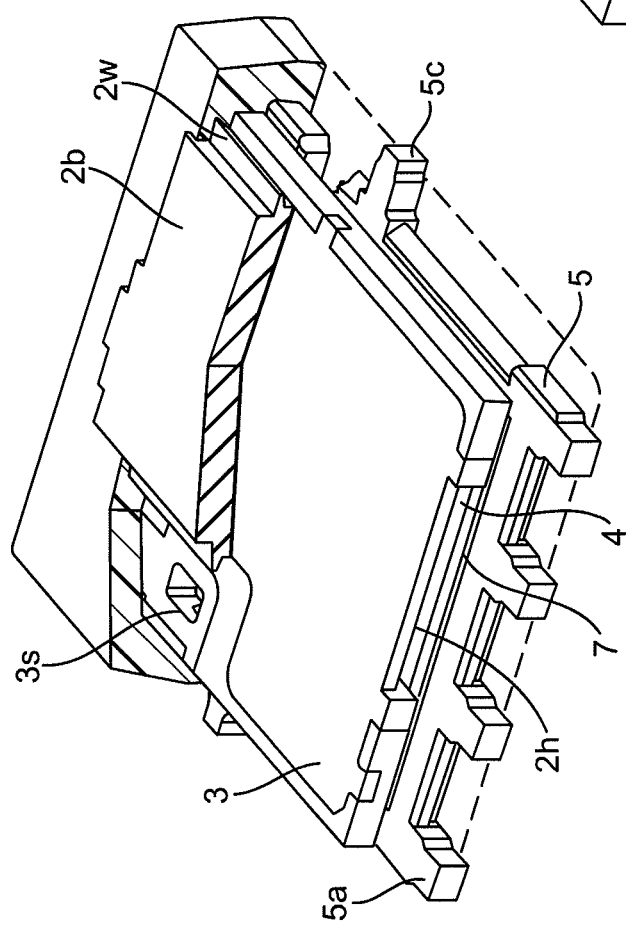
FIG. 19(c) shows a top perspective cutaway view of a semiconductor die package embodiment with an aperture in a gate clip structure.

FIGS. 14(a)-14(c) show top and bottom perspective views of different heat slug embodiments for use with semiconductor die packages 1A, 1B, and 1C shown in FIGS. 15(a)-15(c).

The heat slug 2a in FIG. 14(a) resembles a flat plate with lateral dimensions slightly less than the lateral dimensions of the semiconductor die package 1A in FIG. 15(a). The heat slug 2a may be coupled to solder 10. Also, the molded clip structure 3-1 has a gate clip structure covered with the first molding material.

The heat slug 2a in FIG. 14(b) has a partially etched region 2ah and an unetched region. The etched region 2ah may be cooperatively structured with a portion of the second molding material of the semiconductor die package 1B, which includes surface 6b. Surface 6b is higher than surface 6a. The heat slug 2a may be coupled to solder 10.

Also, the molded clip structure 3-2 has a gate clip structure covered with the second molding material 6 so that the gate clip structure is electrically isolated from the heat slug 2a. The second molding material 6 is selectively laser ablated and surface 6b is not laser ablated so that the second molding material 6 is removed above the solder 10 and above the surface 6a.

The heat slug 2b in FIG. 14(c) has a number of partially etched regions 2ah, 2ah' and an unetched region. As shown in FIG. 15(c), the first etched region 2ah may be disposed over and spaced from a gate contact pad 3gt so that the gate contact pad 3gt and the first etched region 2ah are physically separated from each other and are not electrically coupled together. When the second molding material (not shown) is molded around the components shown in FIG. 15(c), it will fill the space between the first etched region 2*ah* and the gate contact pad 3*gt*. A second etched region 2*ah*' may be used as a mold locking feature to allow the second molding material to lock to the heat slug 2*b*. The first and second etched regions 2*ah*, 2*ah*' are at opposite sides of the heat slug 2*a*.

The methods according to embodiments of the invention can include stacking package components and sandwiching a silicon die between conductive components (e.g., a leadframe structure, a clip structure, and a heat slug). The methods may also include some of the following processes: solder screen printing, solder dispensing (or an equivalent solder application process), pick and place assembly of a die, clip molding and heat slug attachment. Specific details regarding methods according to embodiments of the invention are described below with reference to FIGS. 16, 17, and 18.

After full assembly of the semiconductor die and the stack of metal components, the resulting semiconductor die package precursor is then over-molded with the second molding material. No compressive force is applied to the stack of components during the molding process. The molding material covering the surface of the clip structure is then removed to expose the surface, which may correspond to a top source contact pad of the clip structure (see the packages 1A and 1B in FIGS. 1(*a*) and 1(*b*)).

Alternatively, in another embodiment, the heat slug is covered with the second molding material. It can be thinned down to expose the surface of the heat slug (see the package 1C in FIG. 1(*c*)). In embodiments of the invention, the package thinning process can be performed using laser ablation. This prevents the introduction of mechanical stress into the formed semiconductor die package. The laser ablation process could also be applied in a selective manner (e.g., to produce the package in FIG. 1(*b*)) or in a full scan of package top surface (e.g., to produce the package shown in FIG. 1(*a*)). Selective ablation of the molding material in the semiconductor die package 1B can isolate the gate clip structure from electrical contact with the heat slug (which is electrically coupled to the source clip structure).

One embodiment of the invention is directed to a method comprising: a) attaching a semiconductor die to a die attach pad of a leadframe structure; b) obtaining a molded clip structure comprising a clip structure and a first molding material covering at least a portion of the clip structure, and exposing an outer surface of the clip structure to the semiconductor die; c) molding a second molding material around at least a portion of the semiconductor die and the leadframe structure; and d) attaching a heat slug to the exposed outer surface of the clip structure using a thermally conductive material.

FIGS. 16(*a*)-16(*h*) show perspective views of precursors that are formed during the formation of a semiconductor die package according to an embodiment of the invention.

In FIG. 16(*a*), solder 7 is deposited on the die attach surface of the leadframe structure 5. Solder can be deposited using any suitable solder paste printing process. In other embodiments, a conductive epoxy could be used instead of solder.

As shown in FIG. 16(*b*), a semiconductor die 4 is attached to the die attach region of the leadframe structure 5. The semiconductor die 4 includes a passivation layer 4*a*.

As shown in FIG. 16(*c*), additional solder 9*s*, 9*g* is deposited on the source and gate lead posts 5*d*, 5*f* of the leadframe structure 5. Additional solder 8*s*, 8*g*, is also deposited on the source and gate regions of the semiconductor die 4. Then, the molded clip structure 3 is attached to the top surface of the semiconductor die 4. A source contact 3*sb* at the bottom of the molded clip structure 3 can couple to the source solder 8*s*, while a gate contact 3*gb* at the bottom of the clip structure 3 can couple to the gate solder 8*g*. Other source and gate contacts in the clip structure 3 can couple to the solder 9*s*, 9*g*.

As shown in FIG. 16(*d*), the molded clip structure 3 is then attached to the leadframe structure 5 and the semiconductor die 4.

As shown in FIG. 16(*e*), a second molding material 6 is formed over at least part of the leadframe structure 5 and the semiconductor die 4.

As shown in FIG. 16(*f*), at least part of the second molding material 6 is removed to expose the top surface of the clip structure 3. A laser ablation process can be used to remove the second molding material 6. In this and in other embodiments, suitable conditions for laser ablation may be determined by those of skill in the art.

As shown in FIG. 16(*g*), solder 10 is deposited on the exposed source contact pad 3*st*. The heat slug 2*a* is attached to the exposed source contact pad 3*st* via the solder 10.

As shown in FIG. 16(*h*), a reflow process is then performed. In this and in other embodiments, the reflow process may reflow some or all of the solder previously used to attach the components of the package together. A singulation process, a solder plating process, and a test/mark/tape and reel process are then performed.

FIGS. 17(*a*)-17(*h*) show perspective views of precursors that are formed during the formation of a semiconductor die package according to an embodiment of the invention.

In FIG. 17(*a*), solder 7 is deposited on the die attach surface of the leadframe structure 5. Solder can be deposited using any suitable solder paste printing process. In other embodiments, a conductive epoxy could be used instead of solder.

As shown in FIG. 17(*b*), a semiconductor die 4 is attached to the die attach region of the leadframe structure 5. The semiconductor die 4 includes a passivation layer 4*a*.

As shown in FIG. 17(*c*), additional solder is 9*s*, 9*g* is deposited on the source and gate lead posts 5*d*, 5*f* of the leadframe structure 5. Additional solder 8*s*, 8*g*, is also deposited on the source and gate regions of the semiconductor die 4. Then, the molded clip structure 3 is attached to the top surface of the semiconductor die 4. A source contact 3*sb* at the bottom of the molded clip structure 3 can couple to the source solder 8*s*, while a gate contact 3*gb* at the bottom of the clip structure 3 can couple to the gate solder 8*g*. Other source and gate contacts in the clip structure 3 can couple to the solder 9*s*, 9*g*.

As shown in FIG. 17(*d*), the molded clip structure 3 is then attached to the leadframe structure 5 and the semiconductor die 4.

As shown in FIG. 17(*e*), a second molding material 6 is formed over at least part of the leadframe structure 5 and the semiconductor die 4.

As shown in FIG. 17(*f*), at least part of the second molding material 6 is removed to expose the top surface of the clip structure 3. A laser ablation process can be used to remove the second molding material 6.

As shown in FIG. 17(*g*), solder 10 is deposited on the exposed source contact pad 3*st*. The heat slug 2*a* is attached to the exposed source contact pad 3*st* via the solder 10.

As shown in FIG. 17(*h*), a reflow process is then performed. A singulation process, a solder plating process, and a test/mark/tape and reel process are then performed.

Referring to FIG. 18, in another manufacturing process flow for the semiconductor die package 1-C, the heat slug 2*b* can be attached to the molded clip structure 3 using a high melting solder like 95Pb5Sn before a clip sawing process is performed. FIGS. 18(*a*)-18(*g*) show perspective views of precursors that are formed during the formation of a semiconductor die package according to an embodiment of the invention.

In FIG. 18(*a*), solder 7 is deposited on the die attach surface of the leadframe structure 5. Solder can be deposited using any suitable solder paste printing process. In other embodiments, a conductive epoxy could be used instead of solder.

As shown in FIG. 18(*b*), a semiconductor die 4 is attached to the die attach region of the leadframe structure 5. The semiconductor die 4 includes a passivation layer 4*a*.

As shown in FIG. 18(*c*), additional solder 9*s*, 9*g* is deposited on the source and gate lead posts 5*d*, 5*f* of the leadframe structure 5. Additional solder 8*s*, 8*g*, is also deposited on the source and gate regions of the semiconductor die 4. Then, the molded clip structure 3 is attached to the top surface of the semiconductor die 4. A source contact 3*sb* at the bottom of the molded clip structure 3 can couple to the source solder 8*s*, while a gate contact 3*gb* at the bottom of the clip structure 3 can couple to the gate solder 8*g*. Other source and gate contacts in the clip structure 3 can couple to the solder 9*s*, 9*g*.

As shown in FIG. 18(*d*), the molded clip structure 3 is then attached to the leadframe structure 5 and the semiconductor die 4.

As shown in FIG. 18(*e*), a reflow process is performed to secure the molded clip structure 2*b* to the semiconductor die 4.

As shown in FIG. 18(*f*), a second molding material 6 is formed over at least part of the leadframe structure 5 and the semiconductor die 4.

As shown in FIG. 18(*g*), at least part of the second molding material 6 is removed to expose the top surface of the heat slug 2*b*. A laser ablation process can be used to remove the second molding material 6.

FIG. 19(*a*) shows another semiconductor die package 1D according to an embodiment of the invention. The inner assembly of the semiconductor die package 1D comprises a molded clip structure 3 where through-hole slots 3*s* are designed into the clip structure so that the second molding material 6 can fill the slots 3*s*. This molded clip structure 3 could use, but does not require the use of a laser ablation process to remove molding material at a bottom surface. The slots 3*s* in the molded clip structure 3 will allow vertical locking of the mold compound 6 during final package assembly. It also creates vertical filleting of the solder 8*g*, 8*s* that will improve the inner solder joint reliability of the product.

The heat slug 2*b* also has one or more slots 2*s* to match the one or more molded clip structure slots 3*s* for effective mold filling and mold locking. The slots in these structures may be aligned or may at least overlap. The heat slug 2*b* can be a stamped metal with swaged or etched edges 2*w* for mold locking during final package molding. The heat slug 2*b* also can be exposed through the second molding material 6 using a non-contact ablation process.

The slots 2*s*, 2*g* are examples of apertures, and such apertures may be elongated slots, regular holes, etc. Such apertures may also have any suitable dimensions. They may occupy less than about 50% of the lateral surface area of the clip structures.

Referring to FIG. 19(*b*), in the absence of a heat slug 2*b*, the inner package assembly can be a functional product including a molded clip structure. The illustrated package (due to the use of the slots) has good solder joints due to the vertical filleting of the solder 8*g*, 8*s* with the vertical walls of the molded clip slot 3*s*. This provides for better electrical and mechanical contact between the die 4 and the source and gate clip structures. The package also has good mold locking properties.

In both package assemblies, the through-hole slots 3*s* in the molded clip structure 3 can also serve as a venting window for flux during solder reflow and at the same time can provide a viewing window for visual inspection during manufacturing assembly.

Referring to FIGS. 19(*c*) and 19(*d*) (which shows the underside of the molded clip structure 3), in another semiconductor die package according to an embodiment of the invention, the molded clip structure 3 and the heat slug 2*b* are designed without the source through-hole slot to maximize the heat-sinking area of the clip structure. The second molding material fills the space between the semiconductor die 4 and the molded clip structure 3. The space may include the open half-etched area 3*h* at the underside of the clip structure. The half-etched area 3*h* is defined in part by source pads 3*x*. The source pads 3*x* have areas corresponding to source region contact pads on a semiconductor die.

FIGS. 19(*e*)-19(*g*) show arrays of clip structures and arrays of molded clip structures and illustrate a molded dam feature that is present in the clip structures.

FIG. 19(*e*) shows a bottom view of an array of clip structures 208. An integrally formed mold dam structure 208 is present in the array of clip structures 208, as well as in each of the clip structures in the array of clip structures 208. The area defined by the mold dam structure 206 will not be flooded with the first molding material during the process of molding the first molding material around the array of clip structures 208. Because the mold dam structures are designed in the clip structures in the array of clip structures 208, the solid metal mold dam structures will prevent the molding material from filling-in the enclosed spaces.

FIG. 19(*f*) shows a molded clip structure array 208. The source contact pads of the molded clip will form an integral part of the mold dam structures 206. All of the metal area shown are in direct contact with the mold tool during the clip structure molding process.

FIG. 19(*g*) shows a top perspective view of a molded clip structure array 208.

Additional advantages of embodiments of the invention include a simplified assembly construction and better manufacturability. Heat slug attachment could also be performed while package precursors are still in matrix leadframe or substrate.

Embodiments of the invention have a number of additional advantages. First, major surfaces of the clip structure and a leadframe structure are exposed through molding material in the semiconductor die packages according to embodiments of the invention. Second, the components in the semiconductor die package are stacked in a way that minimizes stress. Third, the top exterior surface of the clip structure can be exposed through a first molding material using a process such as a laser ablation process. Fourth, embodiments of the invention add a heat slug in collection of stacked components in the semiconductor die package. Fifth, using heat slugs with different thicknesses allows for flexibility when manufacturing semiconductor die packages with exposed exterior clip and leadframe structure surfaces. Fifth, depending upon the die lay-out configuration, the heat slug design can be configured such that the outer exposed contact pad dimension is universal. Sixth, the heat slug will provide for an electrical and thermal conductive path to the top of the package, but will not add stress to the stack assembly as it is attached to the top-ablated molded package as a conductive external appendage to the package. The manufacturing process before heat slug attach can be made common with the over-molded version of the package. It is noted that embodiments of the invention may have some or all of the above-noted advantages.

Any of the above-described packages can be used in an electrical assembly, which may include a package mounted to a circuit substrate such as a circuit board. Such assemblies may also be used in systems such as server computers, cell phones, etc.

Any one or more features of one or more embodiments may be combined with one or more features of any other embodiment without departing from the scope of the invention. For example, the clip structure shown in FIG. 19(d) could be used in any of the previously described embodiments.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method comprising:
   (a) attaching a semiconductor die to a die attach pad of a leadframe structure;
   (b) attaching, to the semiconductor die, a molded clip structure comprising a clip structure and a first molding material covering at least a portion of the clip structure, and exposing an outer surface of the clip structure;
   (c) molding a second molding material around at least a portion of the semiconductor die and the leadframe structure; and
   (d) attaching a heat slug to the exposed outer surface of the clip structure.

2. The method of claim 1 wherein the semiconductor die comprises a first surface comprising an input region and a second surf ace comprising an output region.

3. The method of claim 1 wherein (d) is performed before (c).

4. The method of claim 2 wherein the second molding material covers at least the heat slug.

5. The method of claim 1 wherein (a), (b), (c), and (d) are performed in order.

6. The method of claim 1 wherein the heat slug comprises an aperture.

7. The method of claim 6 wherein the semiconductor die comprises a first surface comprising an input region and a second surface comprising an output region, wherein the first surface is opposite to the second surface.

8. The method of claim 1 wherein the second molding material exposes an exterior surf ace of the leadframe structure.

9. The method of claim 1 wherein a semiconductor die package is formed after performing steps (a), (b), (c), and (d) and wherein the method further comprises:
   attaching the semiconductor die package to a circuit substrate.

10. A semiconductor die package comprising:
    a semiconductor die;
    a molded clip structure comprising a clip structure and a first molding material covering at least a portion of the clip structure such that an outer surface of the clip structure is exposed, wherein the clip structure is electrically coupled to the semiconductor die;
    a leadframe structure comprising a die attach pad and a plurality of leads extending from the die attach pad, wherein the semiconductor die is coupled to the die attach pad of the leadframe structure;
    a second molding material covering at least a portion of the semiconductor die and the leadframe structure; and
    a heat slug coupled to the exposed surface of the clip structure.

11. The semiconductor die package of claim 10 wherein the semiconductor die comprises a first surface comprising an input region and a second surface comprising an output region, the input region being coupled to the clip structure and the output region coupled to the die attach pad of the leadframe structure.

12. The semiconductor die package of claim 10 wherein the semiconductor die comprises a first surface comprising a source region and a gate region and a second surface comprising a drain region, and wherein the gate region and the source region are coupled to the clip structure and the drain region is coupled to the die attach pad of the leadframe structure.

13. The semiconductor die package of claim 12 wherein the semiconductor die comprises a power MOSFET.

14. The semiconductor die package of claim 12 wherein the clip structure comprises a gate clip structure and a source clip structure, and wherein the gate clip structure is coupled to the gate region in the semiconductor die and the source clip structure is coupled to the source region in the semiconductor die.

15. The semiconductor die package of claim 14 wherein the source clip structure comprises an aperture.

16. The semiconductor die package of claim 14 wherein the gate clip structure comprises an aperture.

17. The semiconductor die package of claim 16 comprising solder coupling the gate clip structure and the gate region.

18. The semiconductor die package of claim 10 wherein the heat slug comprises a first portion having a first thickness and a second portion comprising a second thickness, and wherein the first thickness and the second thickness are different.

19. The semiconductor die package of claim 10 further comprising an aperture in the heat slug.

20. A system comprising the semiconductor die package of claim 10.

* * * * *